United States Patent
Yafune et al.

(10) Patent No.: US 8,004,022 B2
(45) Date of Patent: Aug. 23, 2011

(54) FIELD EFFECT TRANSISTOR

(75) Inventors: Norimasa Yafune, Fukui (JP); John Kevin Twynam, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 207 days.

(21) Appl. No.: 12/348,927

(22) Filed: Jan. 6, 2009

(65) Prior Publication Data

US 2009/0206373 A1 Aug. 20, 2009

(30) Foreign Application Priority Data

Jan. 7, 2008 (JP) .................. 2008-000470

(51) Int. Cl.
- H01L 29/66 (2006.01)
- H01L 29/80 (2006.01)
- H01L 23/62 (2006.01)
- H01L 27/082 (2006.01)
- H01L 27/148 (2006.01)
- H01L 21/28 (2006.01)
- H01L 21/44 (2006.01)

(52) U.S. Cl. ........ 257/249; 257/194; 257/250; 257/256; 257/357; 257/560; 257/E29.009; 257/E29.312; 257/E21.205; 257/E21.624; 438/140; 438/172; 438/182; 438/454; 438/573; 438/574; 438/578; 438/579

(58) Field of Classification Search .................. 257/194, 257/256, 357, 560, E29.009, E29.258, E29.312, 257/250, E21.205, E21.624; 438/172, 182, 438/140, 454, 573–574, 578–579
See application file for complete search history.

(56) References Cited

U.S. PATENT DOCUMENTS

| | | | |
|---|---|---|---|
| 6,100,571 A | 8/2000 | Mizuta et al. | |
| 6,483,135 B1 * | 11/2002 | Mizuta et al. | 257/283 |
| 6,586,813 B2 * | 7/2003 | Nagahara | 257/472 |
| 7,180,103 B2 * | 2/2007 | Bude et al. | 257/200 |
| 2003/0006437 A1 | 1/2003 | Mizuta et al. | |
| 2003/0132463 A1 * | 7/2003 | Miyoshi | 257/280 |
| 2005/0189559 A1 | 9/2005 | Saito et al. | |
| 2006/0102929 A1 * | 5/2006 | Okamoto et al. | 257/189 |
| 2006/0138454 A1 | 6/2006 | Saito et al. | |
| 2007/0235761 A1 * | 10/2007 | Parikh et al. | 257/194 |
| 2009/0200576 A1 * | 8/2009 | Saito et al. | 257/194 |

FOREIGN PATENT DOCUMENTS

| | | |
|---|---|---|
| JP | 2000-3919 A | 1/2000 |
| JP | 2000-100831 | 4/2000 |
| JP | 2000-100831 A | 4/2000 |
| JP | 2001-230263 | 8/2001 |
| JP | 2001-237250 A | 8/2001 |
| JP | 2004-200248 | 7/2004 |
| JP | 2005-244072 A | 9/2005 |
| JP | 2007-250950 A | 9/2007 |

* cited by examiner

Primary Examiner — Zandra Smith
Assistant Examiner — Jeremy J Joy
(74) Attorney, Agent, or Firm — Birch, Stewart, Kolasch & Birch, LLP

(57) ABSTRACT

A field effect transistor includes a GaN epitaxial substrate, a gate electrode formed on an electron channel layer of the substrate, and source and drain electrodes arranged spaced apart by a prescribed distance on opposite sides of the gate electrode. The source and drain electrodes are in ohmic contact with the substrate. At an upper portion of the gate electrode, a field plate is formed protruding like a visor to the side of drain electrode. Between the electron channel layer of the epitaxial substrate and the field plate, a dielectric film is formed. The dielectric film is partially removed at a region immediately below the field plate, to be flush with a terminal end surface of the field plate. The dielectric film extends from a lower end of the removed portion to the drain electrode, to be overlapped on the drain electrode.

10 Claims, 22 Drawing Sheets

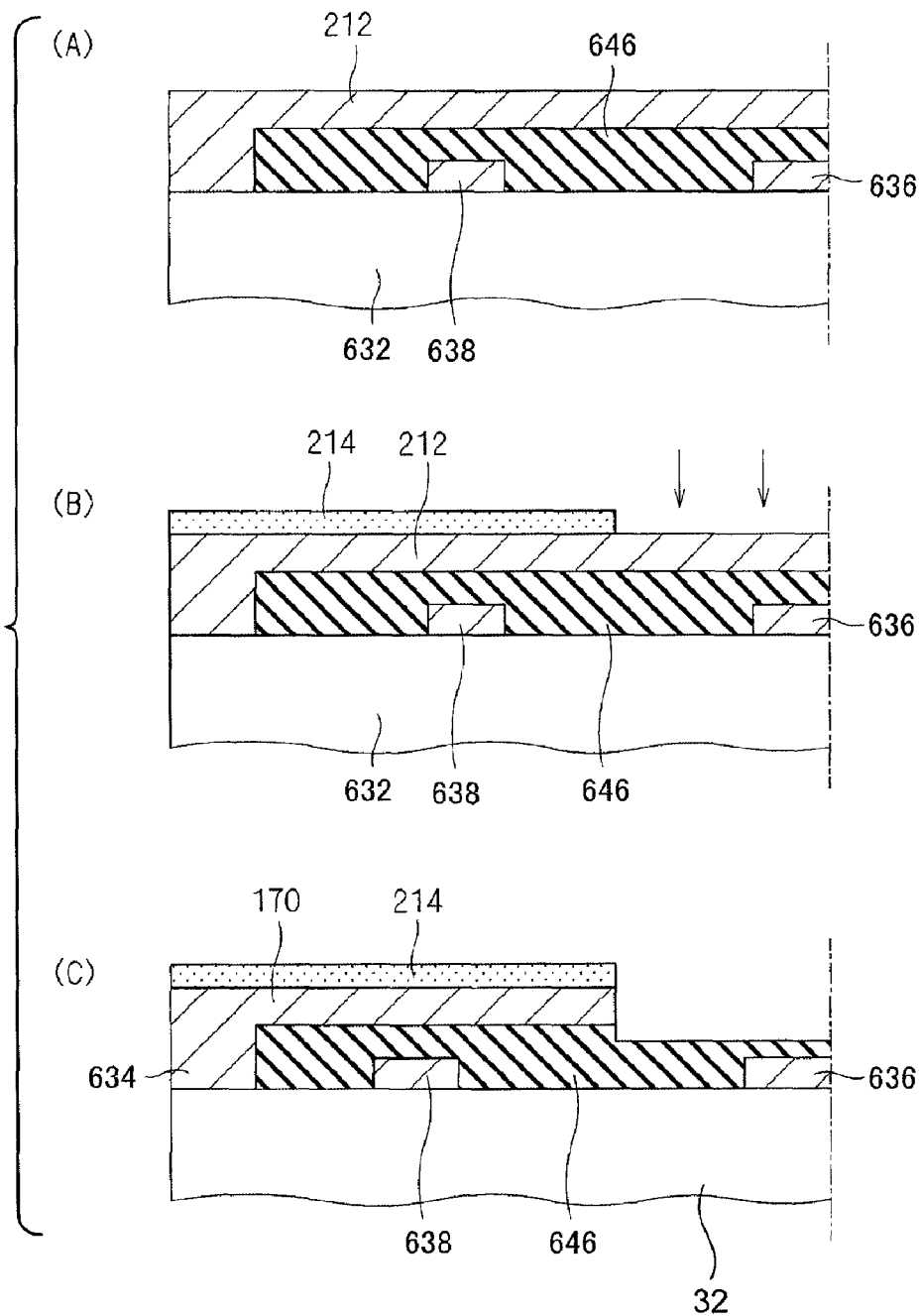

FIELD EFFECT TRANSISTOR

CROSS-REFERENCE TO RELATED APPLICATION

This nonprovisional application claims priority under 35 U.S.C. §119(a) on Patent Application No. 2008-000470 filed in Japan on Jan. 7, 2008, the entire contents of which are hereby incorporated by reference.

BACKGROUND OF THE INVENTION

1. Field of the Invention

The present invention relates to a field effect transistor (hereinafter denoted as an "FET") in which a prescribed electrode has a field-plate structure.

2. Description of the Background Art

As is well known, a nitride compound semiconductor material such as GaN, InGaN, AlGaN and AlInGaN has higher band gap energy than GaAs material and, hence, it has high breakdown voltage. Therefore, a device using a nitride compound semiconductor material is superior in operation under high voltage.

Recently, application of an electronic device, particularly an FFT using GaN, to a high voltage semiconductor device such as a power supply device, has been considered promising.

Among FETs using GaN, a high electron mobility transistor (HEMT) has been known, which has a hetero junction structure including a buffer layer formed of GaN, an electron channel layer formed of an undoped GaN and an electron supplying layer formed of an undoped AlGaN thinner than the electron channel layer, formed successively on a semiconductor substrate such as a sapphire substrate.

The HEMT as such includes an FET having a source electrode, a drain electrode and a gate electrode formed on the above-described layer having hetero junction. On a device surface, a highly insulating dielectric film is deposited.

If a high voltage is applied to such a structure, high electric field concentrates on an end of the electrode, resulting in a breakdown.

In order to alleviate the electric field concentration, an FET has been proposed in which a field plate is formed on the dielectric film to alleviate electric field concentration.

FETs as such are disclosed, for example, in US2003-006437 (hereinafter referred to as '437 reference), JP2001-230263 (hereinafter referred to as '263 reference) and US2006-102929 (hereinafter referred to as '929 reference).

The FETs disclosed in '437 and '263 references have a combined structure of a dielectric film and a step-shaped gate field plate. The dielectric film is adapted to have a two-layered structure to attain both high breakdown voltage and high gain.

The FET disclosed in '929 reference has a combination of two types of dielectric films and a gate field plate structure. This structure is to realize higher breakdown voltage and to prevent collapsing.

SUMMARY OF THE INVENTION

In any of the FET structures disclosed in '437, '263 and '929 references, electric field concentrates to a terminal end of field plate when high voltage is applied and, expected operation of FETs cannot be attained. Therefore, these structures cannot be utilized for a high voltage semiconductor device such as a high voltage switching element.

Specifically, in the technique disclosed in '437 and '263 references, the dielectric film only exists immediately below the field plate, and creeping distance of the dielectric film is the same as the field plate length. Therefore, high electric field concentrates to the terminal end of field plate.

In the technique disclosed in '929 reference, the dielectric film exists not only directly below the field plate but it is extended to the side of drain electrode to overlap with the drain electrode. Therefore, the entire length of dielectric film is longer than the length of field plate. There is a corner, however, at a boundary between the dielectric film and the terminal end of field plate and, therefore, high electric field concentrates at the corner.

According to a first aspect, the present invention provides an FET including, on a surface layer of a semiconductor substrate, a source electrode and a drain electrode arranged spaced apart by a prescribed distance on opposite sides of a gate electrode. The FET includes a field plate protruding like a visor to the side of the drain electrode, formed at an upper portion of the gate electrode. A dielectric film is formed between the field plate and a surface layer of the semiconductor substrate to which the source electrode and the drain electrode are in ohmic contact. The dielectric film is partially removed at a region immediately below the field plate to be flush with a terminal end surface of the field plate and extends from a lower end of the removed portion to the drain electrode to be connected to the drain electrode.

According to a second aspect, the present invention provides an FET including, on a surface layer of a semiconductor substrate, a source electrode and a drain electrode arranged spaced apart by a prescribed distance on opposite sides of a gate electrode. The FET includes a field plate protruding like a visor passing above the gate electrode and to the side of the drain electrode, formed at an upper portion of the source electrode. A dielectric film is formed between the field plate and a surface layer of the semiconductor substrate to which the source electrode and the drain electrode are in ohmic contact. The dielectric film is partially removed at a region immediately below the field plate to be flush with a terminal end surface of the field plate and extends from a lower end of the removed portion to the drain electrode to be connected to the drain electrode.

In the FET above, the removed portion of the dielectric film has its depth set such that, when a prescribed gate voltage is applied to the gate electrode and a prescribed drain voltage is applied to the drain electrode with a voltage applied to the source electrode being ground potential, electric field strength at an upper end portion forming a boundary to the terminal end of the field plate and electric field strength at a lower end become equal to each other.

The depth of the removed portion is set as described above, from the following reason.

If the depth of removed portion is shallower than the depth described above, the electric field strength at an upper end portion of the removed portion exceeds the electric field strength at a lower end, resulting in breakdown of the FET. If the depth of removed portion is deeper than the depth described above, the electric field strength at the lower end of the removed portion exceeds the electric field strength at the upper end, resulting in breakdown of the FET. This is the reason why the depth of removed portion of dielectric film is set as described above.

The optimal depth of removed portion of dielectric film should be determined in consideration of relations among dielectric constant of dielectric film, film thickness of dielectric film immediately below the field plate, length of the field plate, thickness of the field plate and the like. By way of example, when we represent the depth of removed portion of dielectric film by $t1$ and the thickness of dielectric film immediately below the field plate by t0, the depth t1 is preferably set in a range larger than ¼ of film thickness t0 and smaller than ¾ of film thickness t0.

According to an aspect, a recess is formed at a portion of the dielectric film between the drain electrode and the terminal end surface of field plate. As a result, electric field concentration shifts to the side of drain electrode, and therefore, electric field concentration at the end portion of gate electrode to the side of drain electrode can effectively be dispersed or alleviated.

According to another aspect, the dielectric film has a single-layered structure formed of TaOx, SiNx, SiO$_2$ or HfOx.

According to a further aspect, the dielectric film has a two-layered structure, and dielectric constant of a first dielectric film as an upper layer is higher than dielectric constant of a second dielectric film as a lower layer. Here, the balance between collapsing and gate breakdown voltage can be improved, and even if the surface state varies because of variation in manufacturing process, good performance of FET can stably be realized. Here, the second dielectric film may be interposed between the gate electrode and the surface layer of semiconductor substrate. FET adapted to be the MIS (Metal Insulator Semiconductor) type as described above is advantageous as the power transistor handling electric power, since switching speed increases and breakdown resistance is improved. The first dielectric film may be formed of TaOx, SiNx, SiO$_2$ or HfOx, and the second dielectric film may be formed of SiNx.

In the FET of the present invention, the dielectric film immediately below the field plate is partially removed so as to be flush with the terminal end surface of the field plate, and from the lower end of the removed portion, extends to the drain electrode to be connected to the drain electrode. Therefore, the entire length of the dielectric film becomes longer than the field plate, and a corner is not formed at the boundary between the dielectric film and the terminal end of the field plate. As a result, high electric field concentration at the terminal end of field plate can be alleviated. As a result, the FET can be used as a high voltage semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 23 and 24 show, in order of process steps, another method of manufacturing FET 630 shown in FIGS. 19 and 20.

DESCRIPTION OF THE PREFERRED EMBODIMENTS

Figure 1:
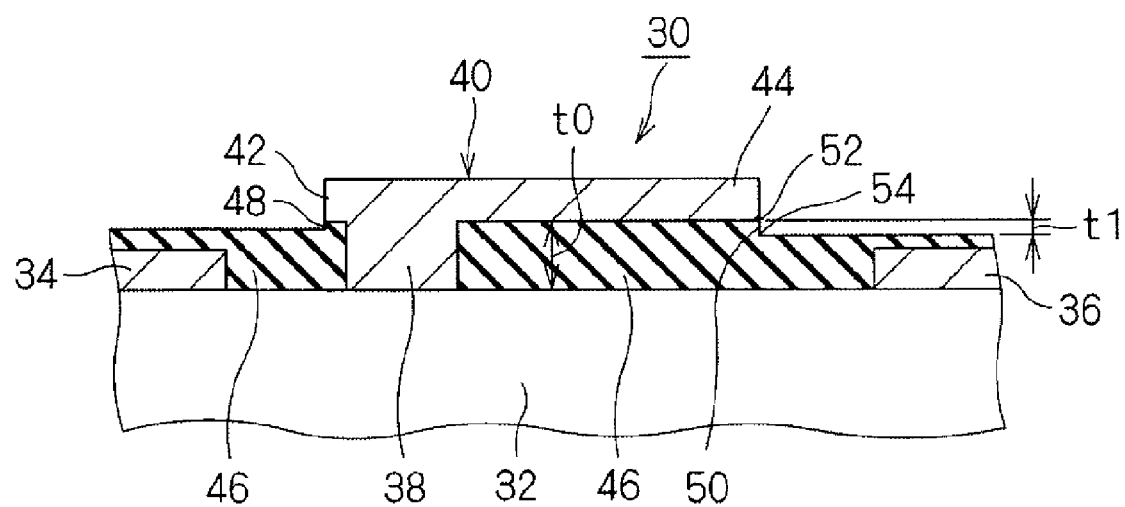
FIG. 1 is a cross-sectional view schematically showing a structure of an FET 30 in accordance with a first embodiment of the present invention.

In the following, embodiments of the present invention will be described in detail with reference to the figures. In the following description and appended drawings, components of the same functions are denoted by the same reference characters. Their names and functions are also the same. Therefore, detailed description thereof will not be repeated.

First Embodiment

Referring to FIG. 1, an FET 30 in accordance with the first embodiment of the present invention is applied to a high voltage semiconductor device such as a high voltage switching element, and it includes a GaN epitaxial substrate 32, a source electrode 34, a drain electrode 36 and a gate electrode 38.

GaN epitaxial substrate 32 has a hetero junction structure including a buffer layer of GaN, an electron channel layer of undoped GaN, and an electron supplying layer of undoped AlGaN thinner than the electron channel layer, stacked successively on a semiconductor substrate such as a sapphire substrate. These buffer layer, electron channel layer and electron supplying layer are formed on the semiconductor substrate mentioned above, by an epitaxial growth method such as molecular beam epitaxy (MBE). In the present embodiment, the buffer layer, the electron channel layer and the electro supplying layer have the film thickness set to 20 nm, 2 nm and 25 nm. It is noted that an epitaxial layer structure of GaN epitaxial substrate 32 is partially etched until the electron channel layer is exposed, so that an element separating mesa, not shown, is formed.

Source electrode 34 and drain electrode 36 are spaced from each other by a prescribed distance on and in ohmic contact with the electron channel layer of the GaN epitaxial substrate 32.

Gate electrode 38 is in Schottky junction with the electron channel layer of epitaxial substrate 32 formed of GaN semiconductor, between source electrode 34 and drain electrode 36. Gate electrode 38 has a field plate 40 at an upper portion, which protrudes like visors both to source electrode 34 and drain electrode 36.

The first visor portion 42 on the side of source electrode 34 of field plate 40 has its terminal end positioned closer to gate electrode 38 than an intermediate position between gate electrode 38 and source electrode 34. On the contrary, the second visor portion 44 on the side of drain electrode 36 of field plate 40 has its terminal end positioned closer to the side of drain electrode 36 than the intermediate position between gate electrode 38 and drain electrode 36. Specifically, the protruding length of second visor portion 44 is set far longer than the protruding length of first visor portion 42.

Between the first and second visor portions 42 and 44 of field plate 40 and the electron channel layer of GaN epitaxial substrate 32, a dielectric film 46 is formed. Dielectric film 46 is formed of TaOx. In the present embodiment, as TaOx, $Ta_2O_5$ is used.

On the side of source electrode 34, dielectric film 46 is partially removed to be flush with the terminal end surface of the first visor portion 42, as shown by a first removed portion 48, in a region immediately below the first visor portion 42 of field plate 40, and it extends flat from the lower end of first removed portion 48 to source electrode 34 to be overlapped on source electrode 34. On the side of drain electrode 36, dielectric film 46 is partially removed to be flush with the terminal end surface of the second visor portion 44, as shown by a second removed portion 50, in a region immediately below the second visor portion 44 of field plate 40, and it extends flat from the lower end of second removed portion 50 to drain electrode 36 to be overlapped on drain electrode 36.

Particularly, the second removed portion 50 of dielectric film 46 has its depth set such that, when a prescribed gate voltage VG is applied to gate electrode 38 and a prescribed drain voltage VD is applied to drain electrode 36, with the voltage applied to source electrode 34 being the ground potential, electric field strength E1 at an upper end 52 forming a boundary to the second visor portion 44 of field plate 40 and electric field strength E2 at a lower end 54 are equal to each other.

The depth of second removed portion 50 of dielectric film 46 has its depth set as described above, from the following reason. Specifically, if the depth of second removed portion 50 is shallower than that mentioned above, electric field strength E1 at the upper end 52 of the second removed portion 50 exceeds the electric field strength E2 at the lower end 54, resulting in a breakdown of FET 30. Similarly, if the depth of second removed portion 50 is deeper than that mentioned above, electric field strength E2 at the lower end 54 of the second removed portion exceeds electric field strength E1 at the upper end 52, resulting in a breakdown of FET 30. This is the reason why the depth of removed portion 50 is set to the thickness described above.

The optimal depth of second removed portion 50 of dielectric film 46 should be determined in consideration of relations among dielectric constant of dielectric film 46, film thickness of dielectric film 46 immediately below the second visor portion 44 of field plate 40, length of the second visor portion 44 of field plate 40, thickness of the field plate 40 and the like. In the present embodiment, when we represent the depth of second removed portion 50 of dielectric film 46 by t1 and the thickness of dielectric film 46 immediately below the second visor portion 44 of field plate 40 by t0, the depth t1 is in the range larger than ¼ of film thickness t0 and smaller than ¾ of film thickness t0.

In the present embodiment, the depth of first removed portion 48 of dielectric film 46 is set similar to the depth of second removed portion 50.

Figure 2:
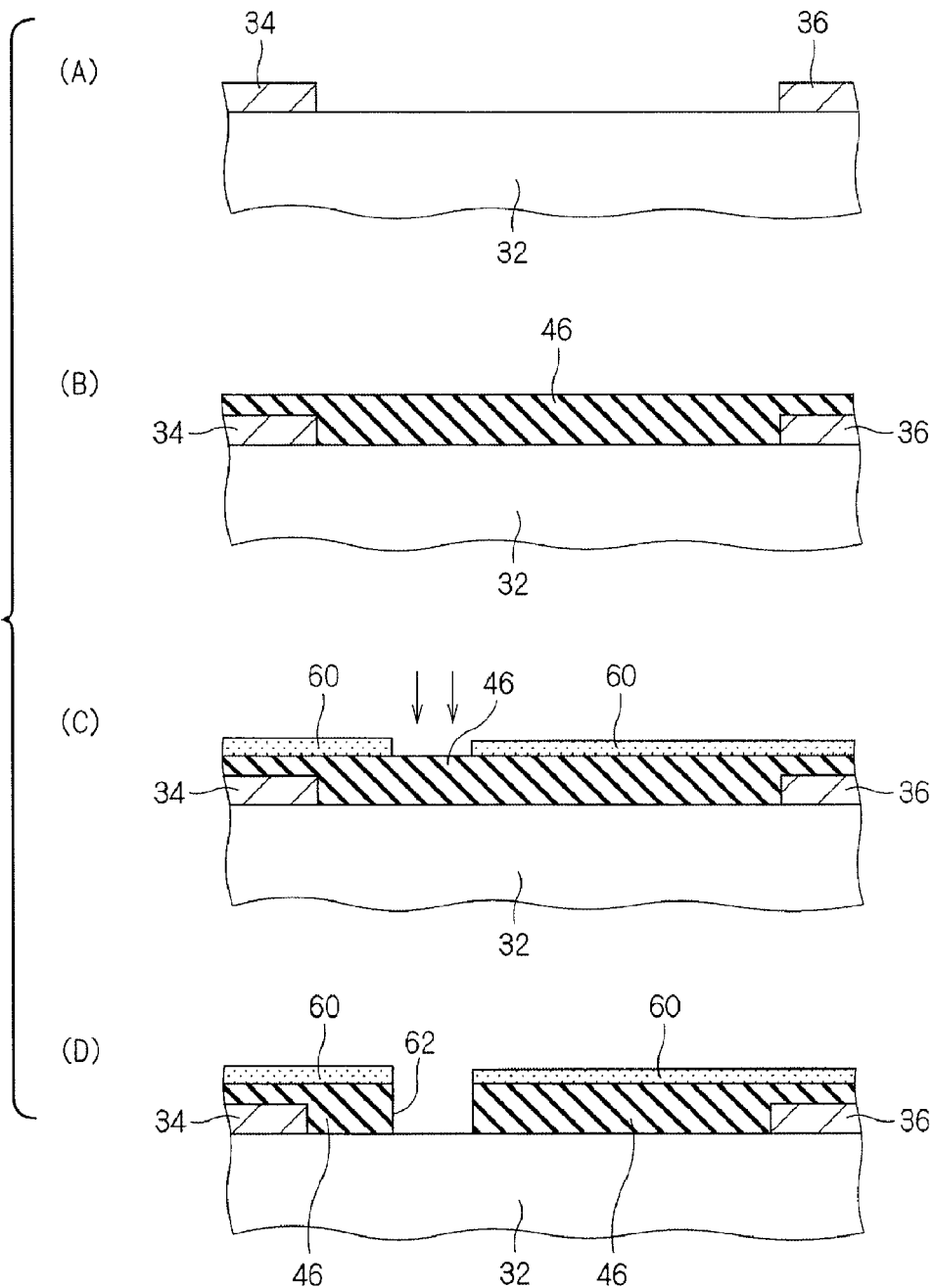
FIGS. 2 and 3 show, in order of process steps, a method of manufacturing FET 30 shown in FIG. 1.
Figure 3:
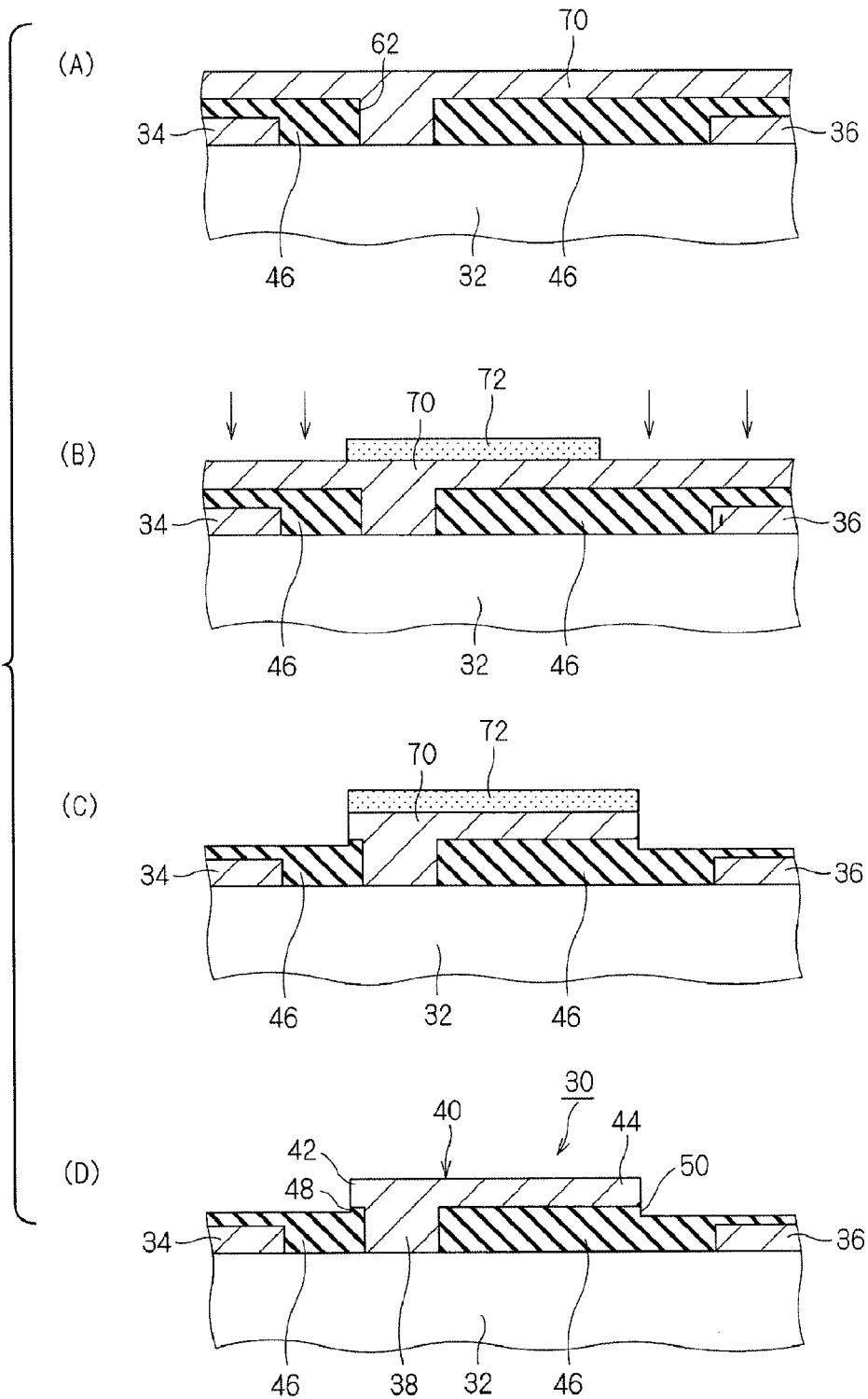

FIGS. 2 and 3 show, in the order of process steps, a method of manufacturing the FET 30. For better understanding of the process step, preceding process steps of FIG. 2 are not shown. In the preceding process steps, the buffer layer, the electron channel layer and the electron supplying layer are stacked successively on the semiconductor substrate by MBE, to form the epitaxial layer structure. Thereafter, the epitaxial layer structure is partially removed by etching until the electron channel layer is exposed, to form the element separating mesa described above. In other embodiments also, the preceding process steps are not shown.

First, as shown in FIG. 2(A), the step of attaining ohmic contact of source electrode 34 and drain electrode 36, by lift-off, is performed. Specifically, first, a pattern is formed by using a resist, on GaN epitaxial substrate 32, and on the electron channel layer of GaN epitaxial substrate 32, a metal film formed of metal such as titanium, aluminum and molybdenum alloy is deposited. The resist pattern is removed by a resist releasing liquid, and the metal film formed on the resist film is also peeled and removed. In this manner, a metal film pattern is formed on GaN epitaxial substrate 32 at a space of resist pattern, and source electrode 34 and drain electrode 36 are formed on the electron channel layer of GaN epitaxial substrate 32. Further, annealing is done at a prescribed temperature (in the present embodiment, 650° C.), to realize ohmic contact between substrate 32 and electrodes 34 and 36.

Next, as shown in FIG. 2(B), the step of forming dielectric film is performed. Specifically, by sputtering, CVD (Chemical Vapor Deposition) or the like, dielectric film 46 of $Ta_2O_5$ (for example, thickness: 350 nm) is formed on the entire surface of substrate 32 and on the structure formed on substrate 32.

Thereafter, the step of opening the gate is performed. Specifically, as shown in FIG. 2(C), regions other than the gate forming region is masked by applying a resist 60, and dry etching or RIE (Reactive Ion Etching) is performed. As a result, the dielectric film 46 in the gate forming region is removed by etching as shown in FIG. 2(D), and an opening 62 is formed, through which the electron channel layer of GaN epitaxial substrate 32 is exposed. At this time point, resist 60 is removed. As to the method of removing resist 60, ashing in $O_2$ plasma or a method using peeling liquid may be used. Similar method is used for removing resist in the subsequent process.

After the opening 62 for forming the gate is formed, metal such as nickel and gold is successively deposited on the entire surface to fill the opening 62, to form a gate metal film 70, by a metal film forming technique such as vacuum vapor deposition or sputtering, as shown in FIG. 3(A).

Thereafter, the step of forming gate electrode is performed. Specifically, as shown in FIG. 3(B), a field plate forming region is masked by applying a resist 72, and dry etching is performed with the etching time adjusted. As a result, parts of gate metal film 70 and dielectric film 46 in the regions other than the region where the resist has been applied are removed by etching, and Schottky junction of gate electrode 38 having field plate 40 to the electron channel layer of GaN epitaxial substrate 32 is attained, as shown in FIG. 3(C). At this time point, resist 72 is removed.

Through the above-described series of process steps, FET 30 in accordance with the present embodiment is manufactured, as shown in FIG. 3(D).

In the structure described above, a prescribed gate voltage VG is applied to gate electrode 38 and a prescribed drain voltage VD is applied to drain electrode 36, with the voltage applied to source electrode 34 being the ground potential, and FET 30 operates thereby.

At this time, when a high reverse voltage is applied across gate-drain, the electric field applied to an end portion of gate electrode 38 on the side of drain electrode 36 is alleviated by the function of field plate 40 of gate electrode 38 and, therefore, the gate breakdown voltage can be improved.

Particularly, assume that a large signal is operated. Here, the dielectric film 46 is partially removed as represented by a removed portion 50, at a region immediately below the field plate 40 of gate electrode 38, to be flush with the terminal end surface of field plate 40. Dielectric film 46 extends from the lower end of removed portion 50 to the drain electrode 36, to be overlapped on drain electrode 36. The entire length of dielectric film 46 becomes longer than the field plate length, and there is no corner formed at the boundary to the terminal end of field plate 40. Therefore, high electric field concentration at the terminal end of field plate 40 can be alleviated. As a result, it becomes possible to use FET 30 as a high voltage semiconductor device.

Second Embodiment

Figure 4:
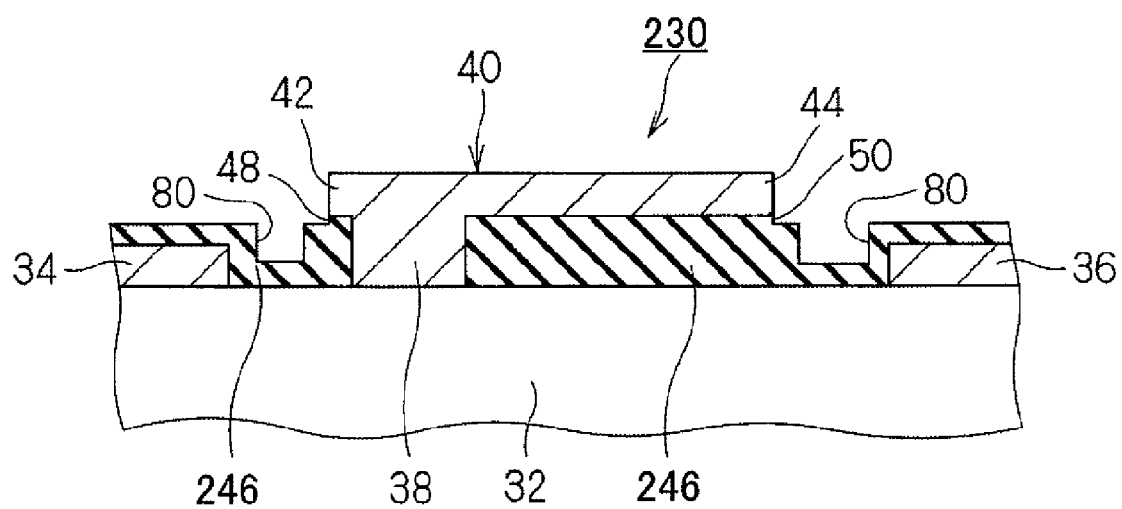
FIG. 4 is a cross-sectional view schematically showing a structure of an FET 230 in accordance with a second embodiment.

Referring to FIG. 4, an FET 230 in accordance with the second embodiment is characterized in that a recess 80 is formed at a portion of dielectric film 246 between source electrode 34 and a terminal end surface of a first visor portion 42 of field plate 40, and at a portion between drain electrode 36 and a terminal end surface of a second visor portion 44 of field plate 40, respectively. Except for this point, the structure is the same as that of the first embodiment.

Figure 5:
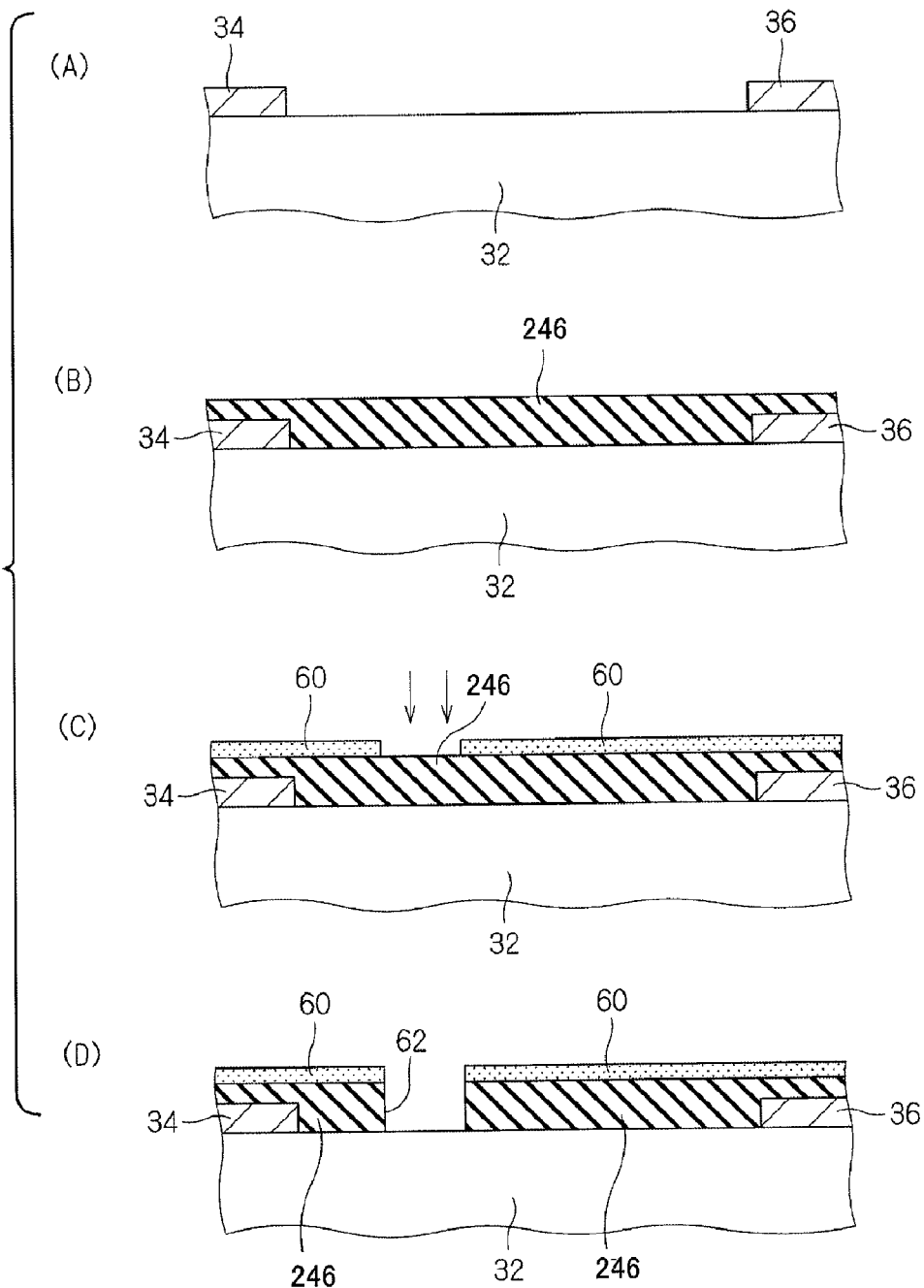
FIGS. 5 and 6 show, in order of process steps, a method of manufacturing FET 230 shown in FIG. 4.
Figure 6:
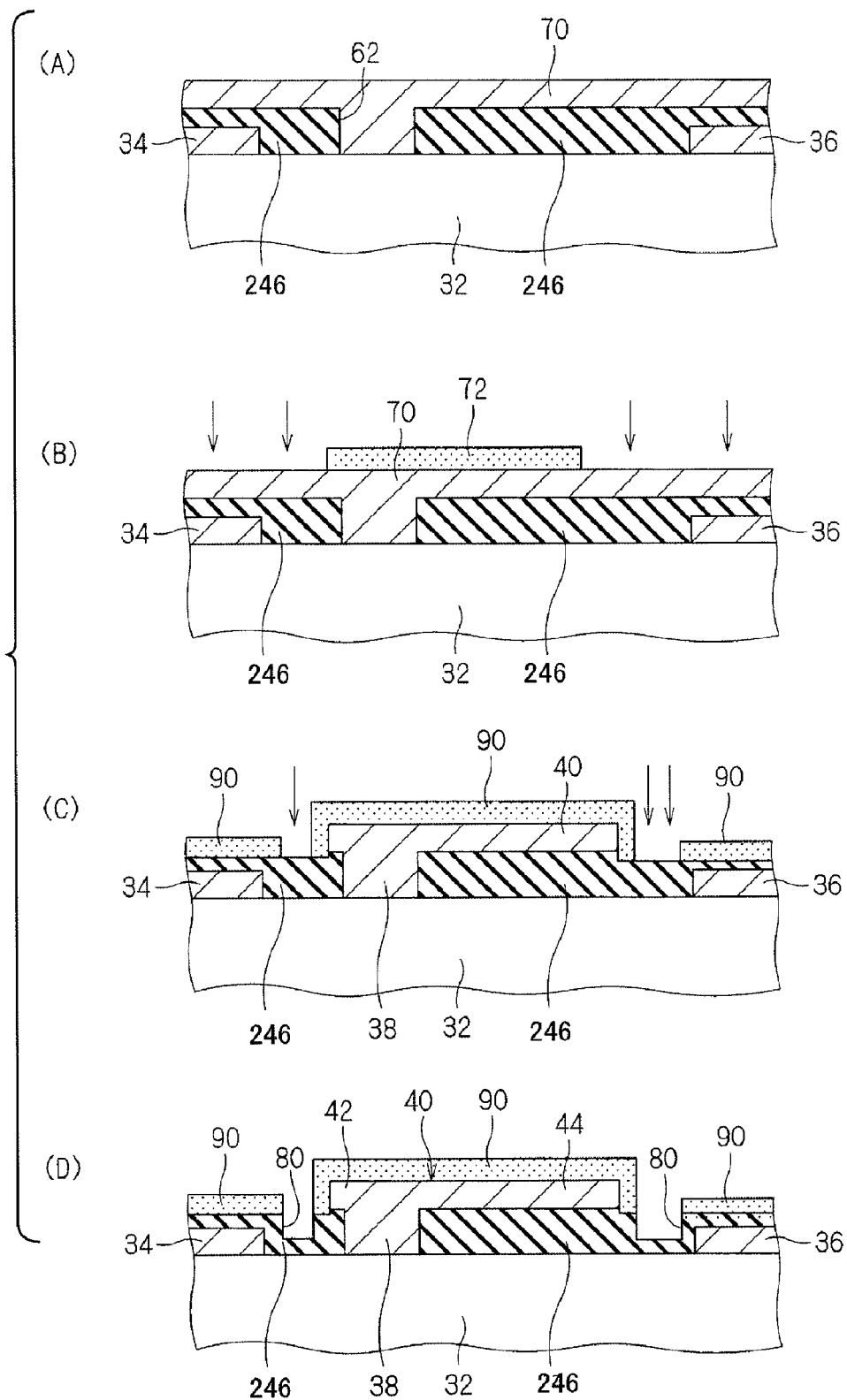

Referring to FIGS. 5 and 6, FET 230 is manufactured in the following manner. The process from the step of attaining ohmic contact of source electrode 34 and drain electrode 36 to the step of forming gate electrode 38 having field plate 40 shown in FIGS. 5(A) to 6(B) are the same as those of the first embodiment and, therefore, description of these process steps will not be repeated.

When formation of gate electrode 38 having the field plate structure ends, regions other than the recess forming regions are masked by applying a resist 90 as shown in FIG. 6(C), and dry etching is performed. As a result, as shown in FIG. 6(D), parts of dielectric film 246 in the recess forming regions where resist 90 is not applied are removed, and recesses 80 are formed between source electrode 34 and the terminal end surface of first visor portion 42 of field plate 40 and between drain electrode 36 and the terminal end surface of second visor portion 44 of field plate 40. At this time point, resist 90 is removed.

Through these process steps, FET 230 of the present embodiment shown in FIG. 4 is formed.

In the structure above, recess 80 is formed between drain electrode 36 and the terminal end surface of field plate 40 and, therefore, electric field concentration is shifted to the side of drain electrode 36, whereby the electric field concentration at the end portion of gate electrode 38 on the side of drain electrode 36 can effectively be dispersed and alleviated. Other functions and effects are the same as those of the first embodiment.

Third Embodiment

Figure 7:
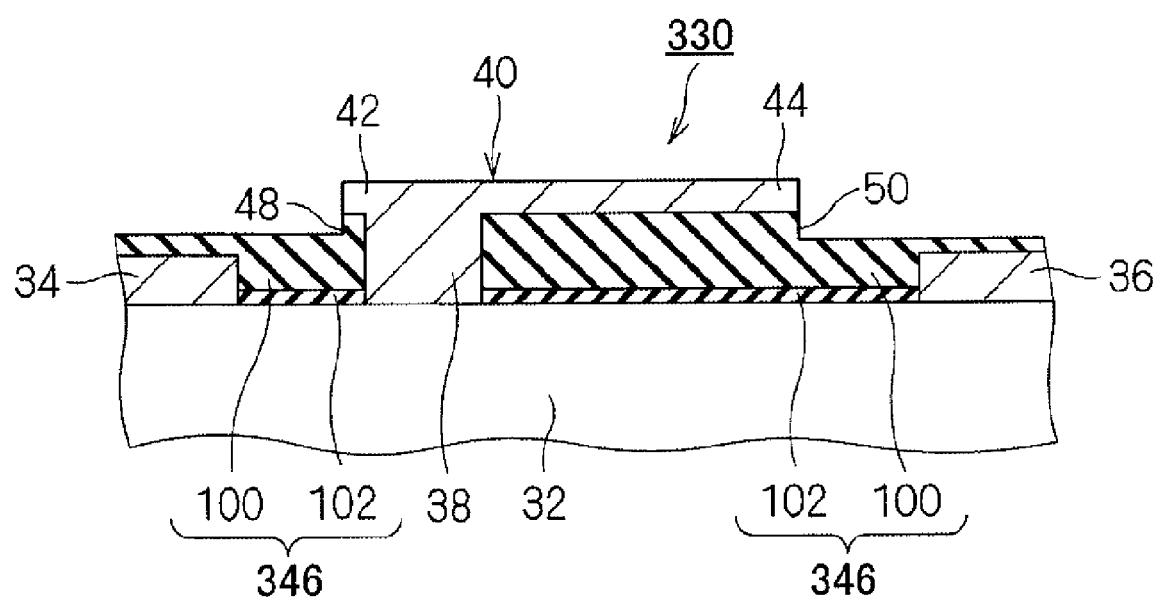
FIG. 7 is a cross-sectional view schematically showing a structure of an FET 330 in accordance with a third embodiment.

Referring to FIG. 7, an FET 330 in accordance with the third embodiment of the present invention is characterized in that dielectric film 346 has a two-layered structure including first and second dielectric films 100 and 102 having mutually different dielectric constants. Except for this point, the structure is the same as that of the first embodiment.

Dielectric constant of the first dielectric film 100 as the upper layer is set to be higher than that of the second dielectric film 102 as the lower layer. Specifically, the first dielectric film 100 is formed of TaOx, and the second dielectric film 102 is formed of SiNx. In the present embodiment, Ta$_2$O$_5$ is used as the first dielectric film 100, and SiN is used as the second dielectric film 102.

Figure 8:
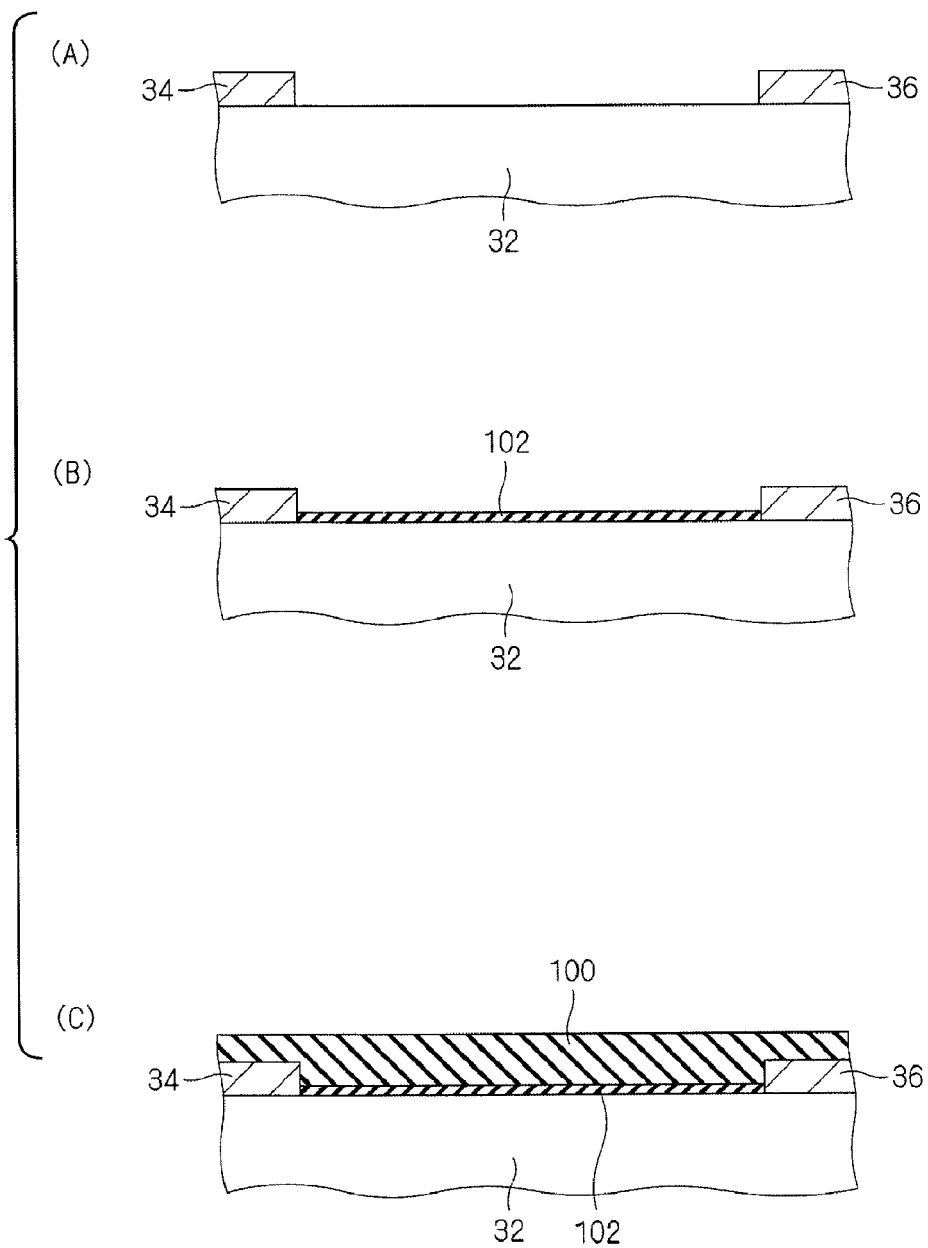
FIGS. 8 to 10 show, in order of process steps, a method of manufacturing FET 330 shown in FIG. 7.
Figure 9:
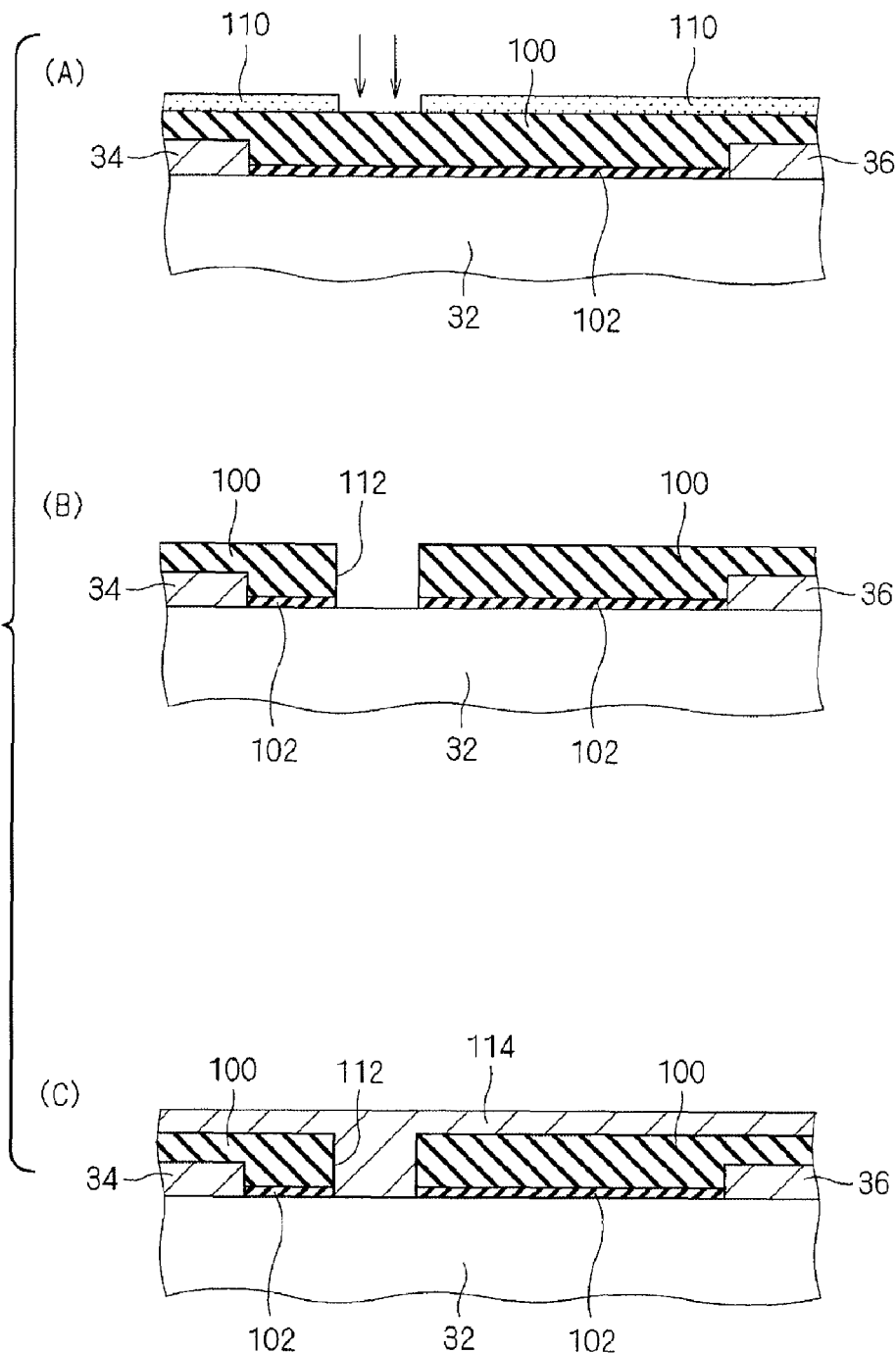
Figure 10:
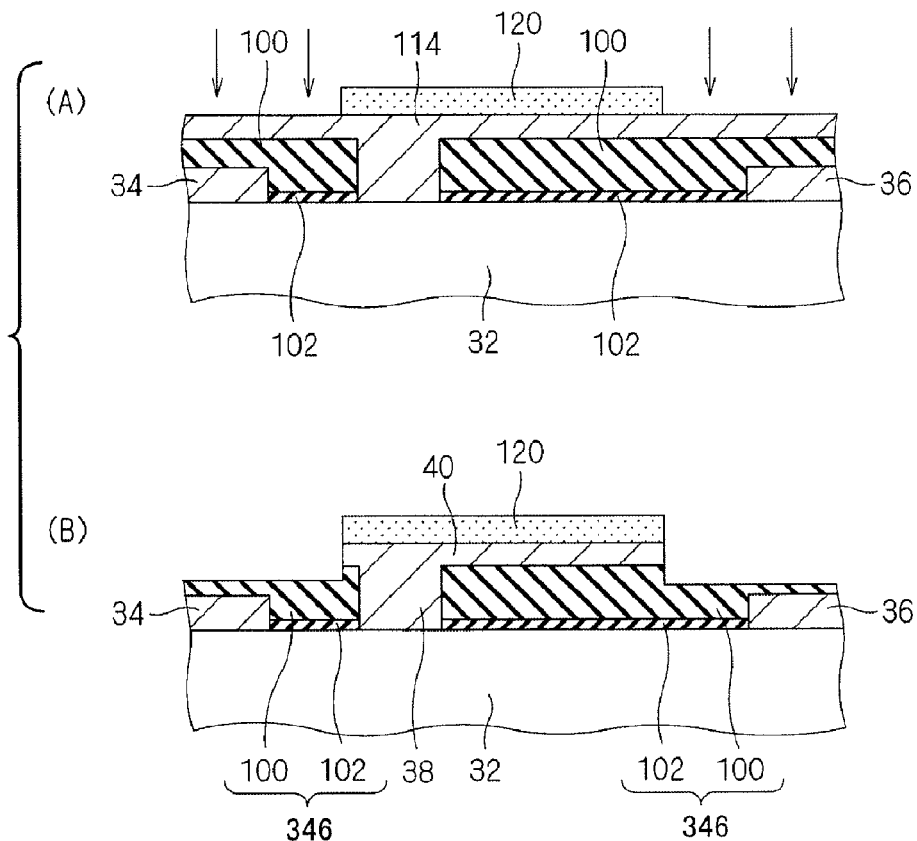

Referring to FIGS. 8 to 10, FET 330 in accordance with the present embodiment is manufactured in the following manner.

First, as shown in FIG. 8(A), by lift-off, source electrode 34 and drain electrode 36 are formed on the electron channel layer of GaN epitaxial substrate 32, to attain ohmic contact of these electrodes 34 and 36.

Next, as shown in FIG. 8(B), by sputtering, CVD or the like, second dielectric film 102 (for example, film thickness: 50 nm) of SiN is formed on the electron channel layer of GaN epitaxial substrate 32 between source electrode 34 and drain electrode 36.

Further, as shown in FIG. 8(C), by sputtering, CVD or the like, first dielectric film 100 (for example, film thickness: 150 nm) of Ta$_2$O$_5$ is formed on the entire surface.

Next, as shown in FIG. 9(A), regions other than the gate forming region are masked by applying a resist 110, and dry etching or RIE is performed. As a result, as shown in FIG. 9(B), the first and second dielectric films 100 and 102 in the gate forming region are removed by etching, and an opening 112 is formed, through which electron channel layer of GaN epitaxial substrate 32 is exposed. At this time point, resist 110 is removed.

When the opening 112 for forming the gate is formed, as shown in FIG. 9(C), metal such as nickel and gold is successively deposited on the entire surface to fill the opening 112 by metal film forming technique such as vacuum vapor deposition or sputtering, whereby a gate metal film 114 is formed.

Thereafter, as shown in FIG. 10(A), a resist 120 is applied to the field plate forming region, and dry etching is performed with the etching time adjusted. As a result, as shown in FIG. 10(B), parts of gate metal film 114 and first dielectric film 100 in the region other than the region where resist has been applied are removed by etching, and Schottky junction of gate electrode 38 having field plate 40 to the electron channel layer of GaN epitaxial substrate 32 is attained. At this time point, resist 120 is removed.

Through the series of process steps described above, FET 330 in accordance with the present embodiment shown in FIG. 7 is manufactured.

In the structure described above, dielectric film 346 is formed to have a two-layered structure, with the dielectric constant of the first dielectric film 100 as the upper layer set higher than that of the second dielectric film 102 as the lower layer. Therefore, the balance between collapsing and gate breakdown voltage can be improved, and even when surface state varies because of variations in the manufacturing process, good performance of FET 330 can be realized in a stable manner. Other functions and effects are the same as those of the first embodiment.

Fourth Embodiment

Figure 11:
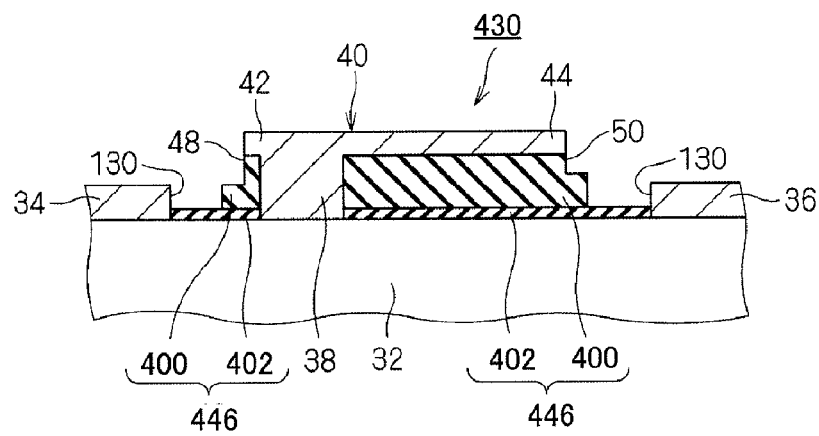
FIG. 11 is a cross-sectional view schematically showing a structure of an FET 430 in accordance with a fourth embodiment.

Referring to FIG. 11, an FET 430 in accordance with the fourth embodiment of the present invention is that at a portion of the dielectric film between source electrode 34 and the terminal end surface of first visor portion 42 of field plate 40, and at a portion between drain electrode 36 and the terminal end surface of the second visor portion 44 of field plate 40, recesses 130 are formed, respectively. Except for this point, the structure is the same as that of the third embodiment. FET 430 shown in FIG. 11 has, in place of dielectric film 346 shown in FIG. 7, a dielectric film 446 having the two-layered structure including first and second dielectric films 400 and 402 having mutually different dielectric constants, similar to first and second dielectric films 100 and 102 of dielectric film 346.

Figure 12:
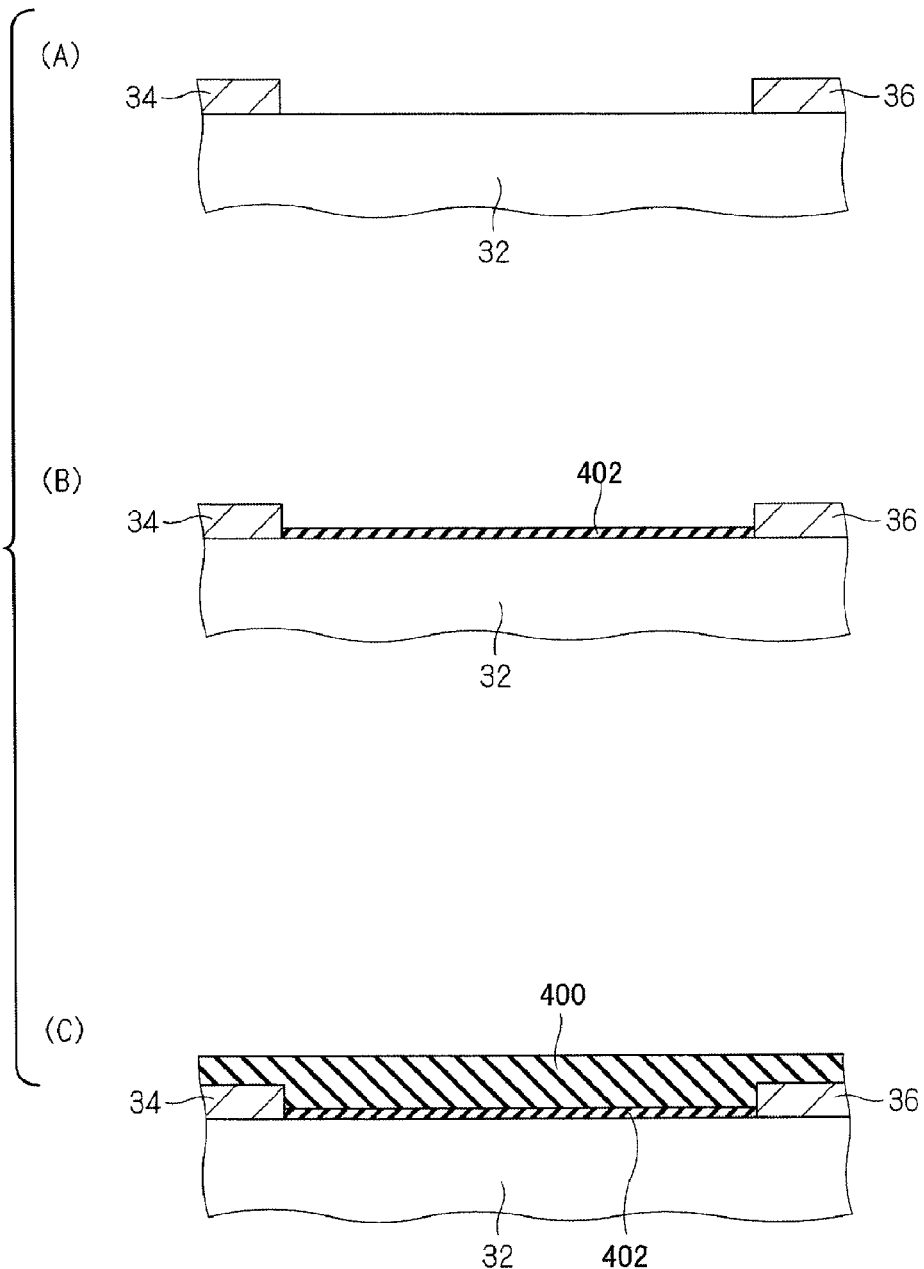
FIGS. 12 to 14 show, in order of process steps, a method of manufacturing FET 430 shown in FIG. 11.
Figure 13:
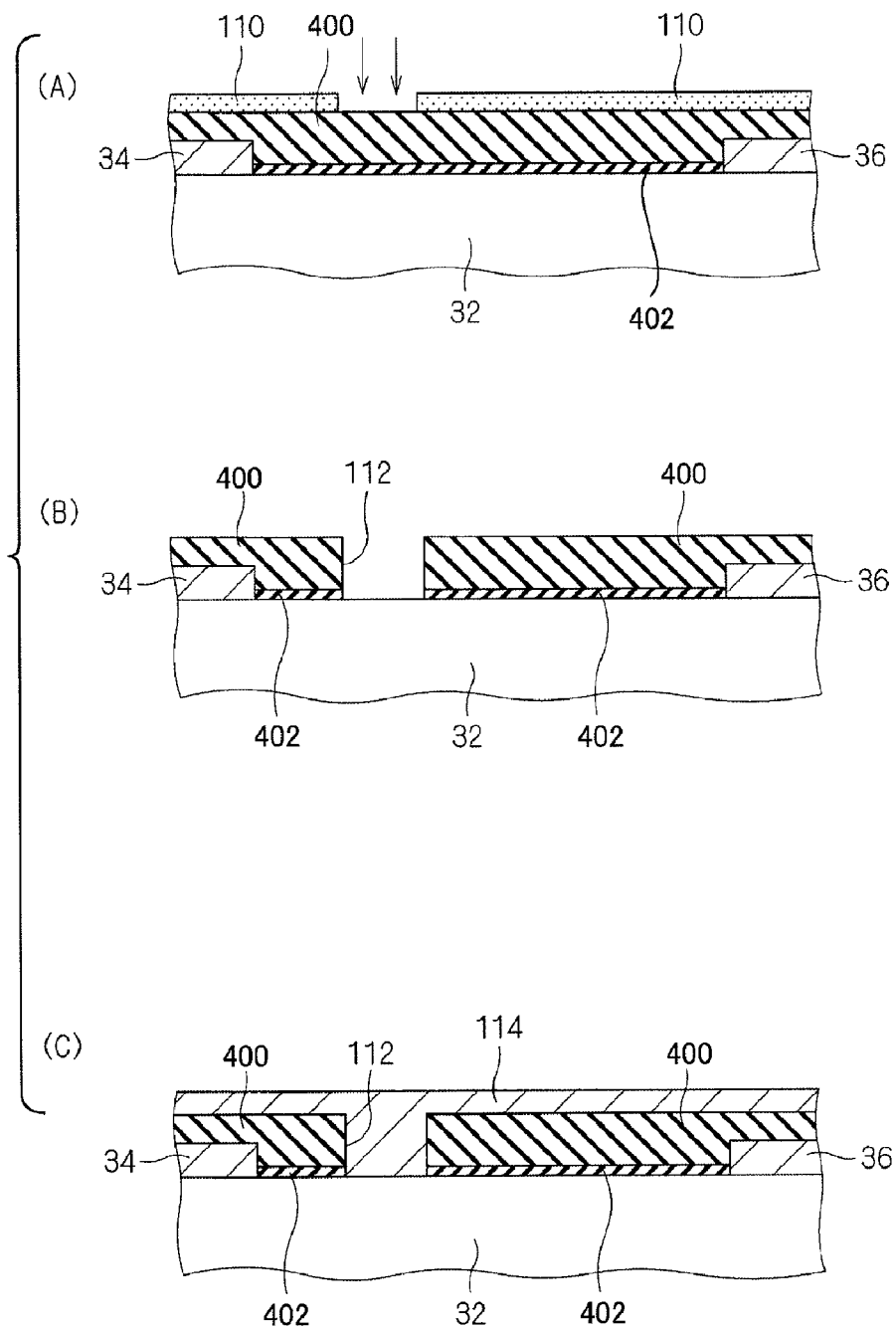
Figure 14:
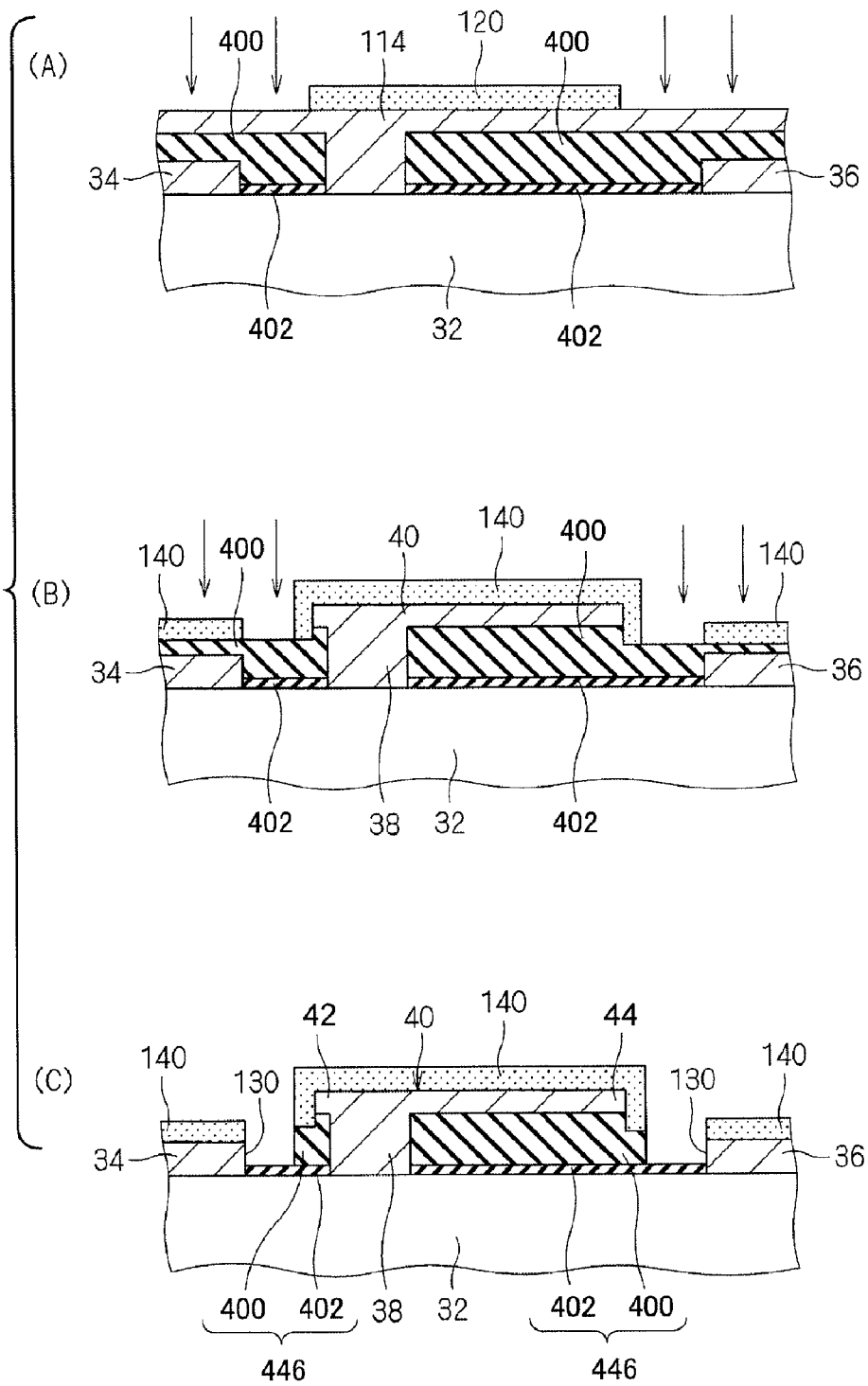

Referring to FIGS. 12 to 14, FET 430 in accordance with the present embodiment is manufactured in the following manner.

From the step of attaining ohmic contact of source electrode 34 and drain electrode 36 to the step of forming gate electrode 38 having field plate 40 shown in FIGS. 12(A) to 14(A) are the same as those of the third embodiment, except that dielectric films 400 and 402 are formed in place of dielectric films 100 and 102. Therefore, detailed description of these process steps will not be repeated.

When formation of gate electrode 38 having the field plate structure ends, as shown in FIG. 14(B), regions other than the recess forming regions are masked by applying a resist 140, and dry etching is performed. As a result, as shown in FIG. 14(C), the first dielectric film 400 in the recess forming regions to which resist 140 is not applied, is removed, and recesses 130 are formed between the source electrode 34 and the terminal end surface of the first visor portion 42 of field plate 40 and between drain electrode 36 and the terminal end surface of the second visor portion 44 of field plate 40. At this time, the second dielectric film 402 serves as an etching stopper. Then, resist 140 is removed.

Through these steps, FET 430 in accordance with the present embodiment shown in FIG. 11 is formed.

In the structure described above, as the recess 130 is formed between drain electrode 36 and the terminal end surface of field plate 40, electric field concentration is shifted to the side of drain electrode 36, and therefore, the electric field concentration at the end portion of gate electrode 38 on the side of drain electrode 36 can effectively be dispersed and alleviated. Other functions and effects are the same as those of the third embodiment.

Fifth Embodiment

Figure 15:
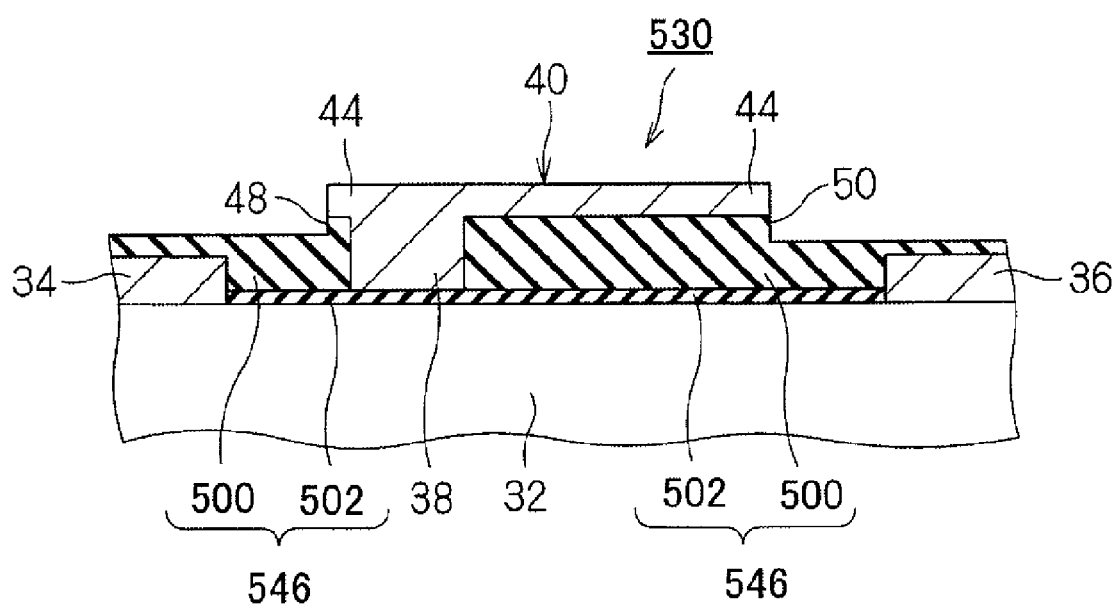
FIG. 15 is a cross-sectional view schematically showing a structure of an FET 530 in accordance with a fifth embodiment.

Referring to FIG. 15, an FET 530 in accordance with the fifth embodiment of the present invention is characterized in that it has a dielectric film 546 having a two-layered structure including first and second dielectric films 500 and 502 in place of dielectric film 346 of the third embodiment, and that the second dielectric film 502 is interposed between gate electrode 38 and the electron channel layer of GaN epitaxial substrate 32 to realize MIS type structure. Except for these points, the structure is the same as that of the third embodiment.

Figure 16:
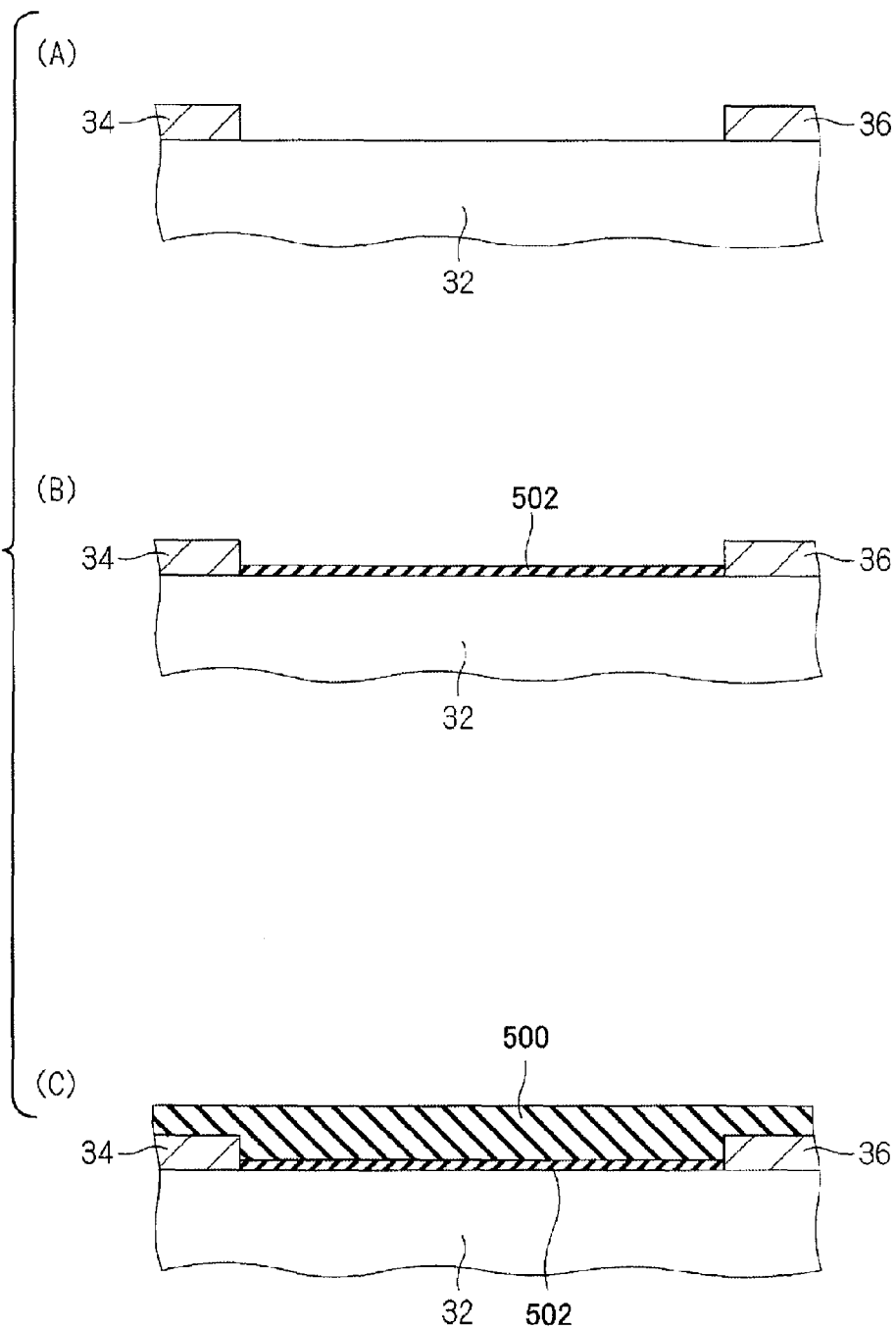
FIGS. 16 to 18 show, in order of process steps, a method of manufacturing FET 530 shown in FIG. 15.
Figure 17:
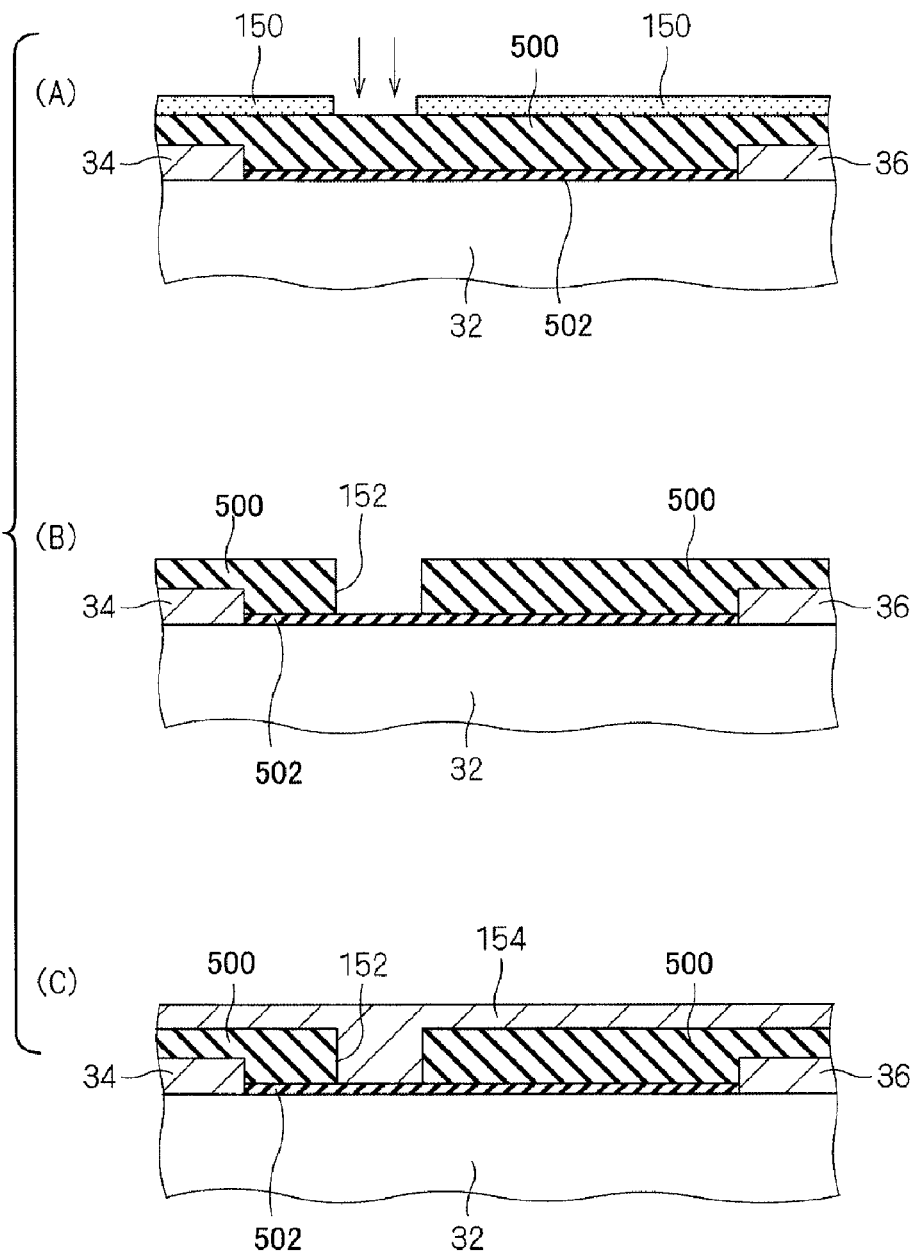
Figure 18:
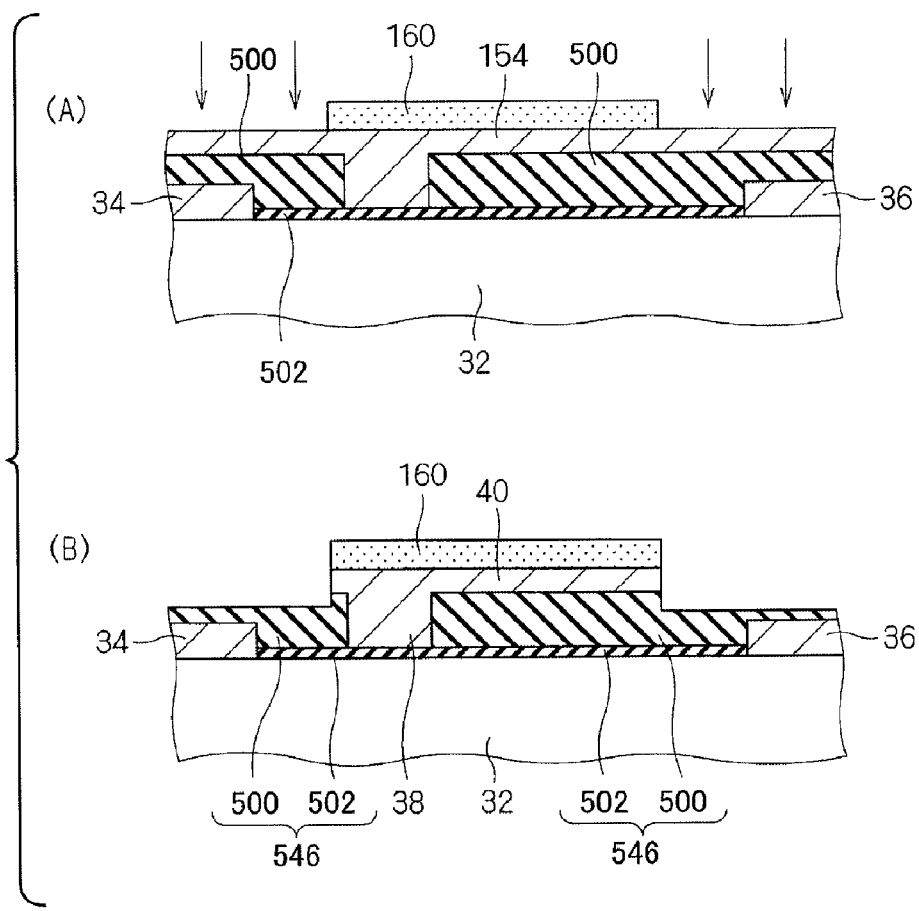

Referring to FIGS. 16 to 18, FET 530 in accordance with the present embodiment is manufactured in the following manner.

First, as shown in FIG. 16(A), source electrode 34 and drain electrode 36 are formed on the electron channel layer of GaN epitaxial substrate 32 by lift-off, and ohmic contact of these electrodes 34 and 36 are attained.

Thereafter, as shown in FIG. 16(B), by sputtering, CVD or the like, second dielectric film 502 of SiN film is formed on the electron channel layer of GaN epitaxial substrate 32 between source electrode 34 and drain electrode 36 and, thereafter, as shown in FIG. 16(C), by sputtering, CVD or the like, the first dielectric film 500 of $Ta_2O_5$ is formed on the entire surface.

Thereafter, as shown in FIG. 17(A), regions other than the gate forming region are masked by applying a resist 150, and dry etching or RIE is performed. As a result, as shown in FIG. 17(B), the first dielectric film 500 in the gate forming region is removed by etching, and in the gate forming region, an opening 152 is formed, through which the second dielectric film 502 is exposed. At this time, the second dielectric film 502 serves as an etching stopper. Resist 150 is removed.

After the opening 152 for forming the gate is formed, as shown in FIG. 17(C), metal such as nickel and gold is successively stacked on the entire surface to fill the opening 152, by metal film forming technique such as vacuum vapor deposition or sputtering, to form a gate metal film 154.

Thereafter, as shown in FIG. 18(A), a field plate forming region is masked by applying a resist 160, and dry etching is performed with etching time adjusted. As a result, as shown in FIG. 18(B), part of gate metal film 154 and part of the first dielectric film 500 in the regions other than the region where resist has been applied are removed by etching, and Schottky junction of gate electrode 38 having field plate 40 to the electron channel layer of GaN epitaxial substrate 32 is attained. At this time point, resist 160 is removed.

Through the series of operations described above, FET 530 in accordance with the present embodiment shown in FIG. 15 is manufactured.

In the structure described above, the second dielectric film 502 is interposed between gate electrode 38 and the electron channel layer of GaN epitaxial substrate 32 to realize MIS type structure. It is advantageous for a power transistor handling electric power, as the switching speed increases and breakdown resistance increases. Other functions and effects are the same as those of the third embodiment.

Sixth Embodiment

Figure 19:
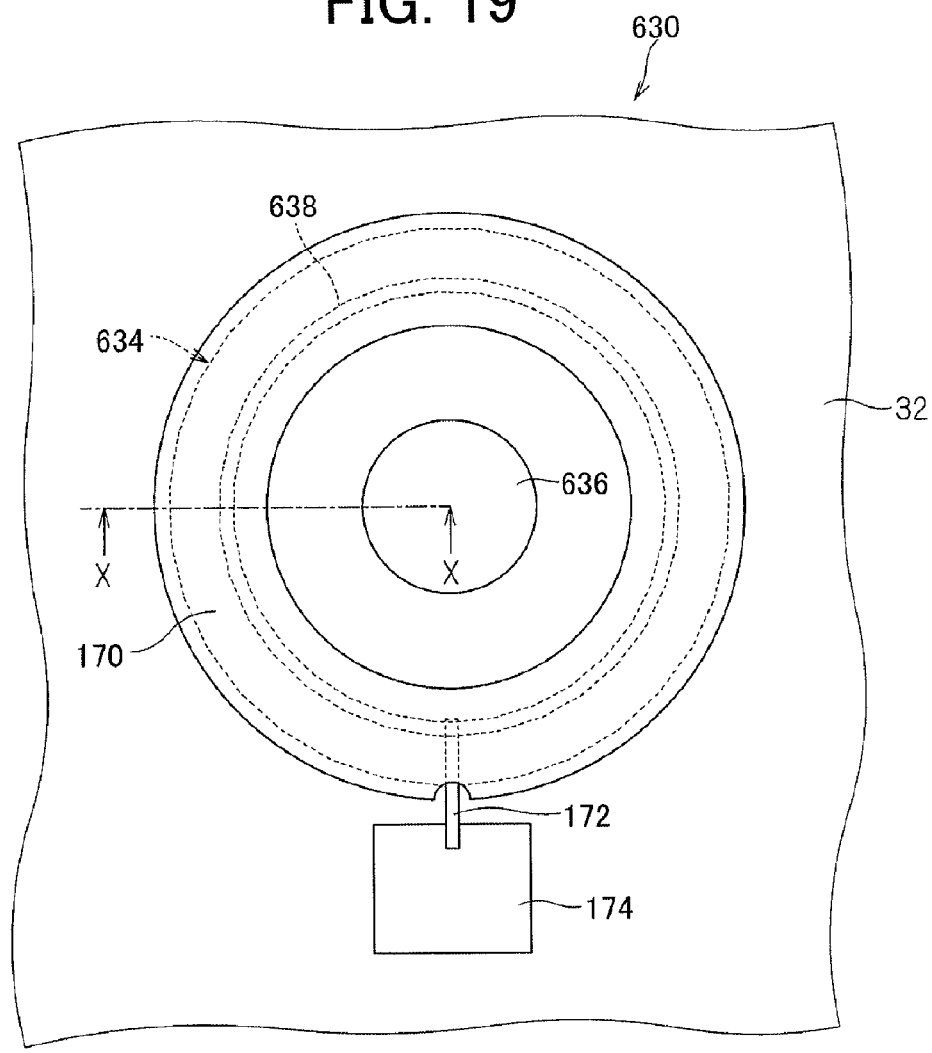
FIG. 19 is a plan view of an FET 630 in accordance with a sixth embodiment.
Figure 20:
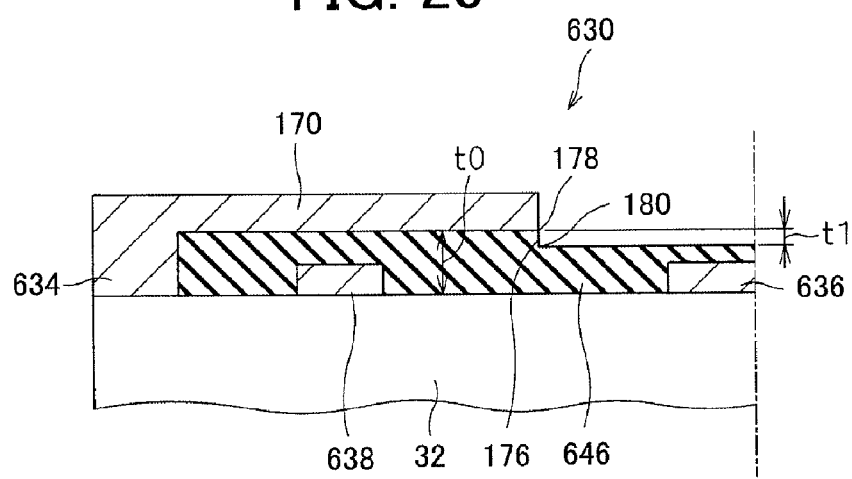
FIG. 20 is a cross-sectional view taken along the line X-X of FIG. 19.

Referring to FIGS. 19 and 20, FET 630 in accordance with the sixth embodiment of the present invention includes a drain electrode 636 having a circular shape, a gate electrode 638 arranged radially outward and spaced by a prescribed distance from drain electrode 636 and having an annular shape concentrical with drain electrode 636, and a source electrode 634 arranged radially outward of gate electrode 638 and having an annular shape concentrical with drain electrode 636. The diameter of gate electrode 638 is made smaller than the diameter of source electrode 634.

Above source electrode 634, a field plate 170 is formed, passing above gate electrode 638 and protruding like a visor to the side of drain electrode 636. Gate electrode 638 is connected through a conductor pattern 172 drawn outer than the source electrode 634 in the radial direction to a gate lead electrode 174.

Source electrode 634 and drain electrode 636 are in ohmic contact with GaN epitaxial substrate 32. Between the electron channel layer of GaN epitaxial substrate 32 and field plate 170, a dielectric film 646 of TaOx is formed. In the present embodiment, $Ta_2O_5$ is used as TaOx.

Dielectric film 646 is partially removed as represented by removed portion 176 in a region directly below field plate 170 to be flush with a terminal end surface of field plate 170, and extends flat from the lower end of removed portion 176 to drain electrode 636 to be overlapped on drain electrode 636.

The depth of removed portion 176 of dielectric film 646 is set in the following manner. Specifically, assume that a prescribed gate voltage VG is applied to gate electrode 638, with the voltage applied to source electrode 634 being the ground potential. At the same time, a prescribed drain voltage VD is applied to drain electrode 636. The depth of removed portion 176 is set such that electric field strength E1 at an upper end portion 178 forming a boundary to the terminal end of field plate 170 and electric field strength E2 at a lower end at this time become equal to each other.

The depth of removed portion 176 of dielectric film 646 is set as described above, from the following reason. Specifically, if the depth of removed portion 176 is shallower than the depth mentioned above, electric field strength E1 at the upper end portion 178 of removed portion 176 exceeds electric field strength E2 at the lower end portion 180, resulting in breakdown of FET 630. Similarly, if the depth of removed portion 176 is deeper than the depth mentioned above, electric field strength E2 at the lower end portion 180 of removed portion 176 exceeds electric field strength E1 at the upper end portion 178, resulting in breakdown of FET 630. Therefore, the depth of removed portion 176 is set as described above.

The optimal depth of removed portion 176 of dielectric film 646 should be determined in consideration of relations among dielectric constant of dielectric film 646, film thickness of dielectric film 646 immediately below field plate 170, length of field plate 170, thickness of field plate 170 and the like. In the present embodiment, when we represent the depth of removed portion 176 of dielectric film 646 by t1 and thickness of dielectric film 646 immediately below field plate 170 by t0, the depth t1 is set in the range larger than ¼ of film thickness t0 and smaller than ¾ of film thickness t0.

Figure 21:
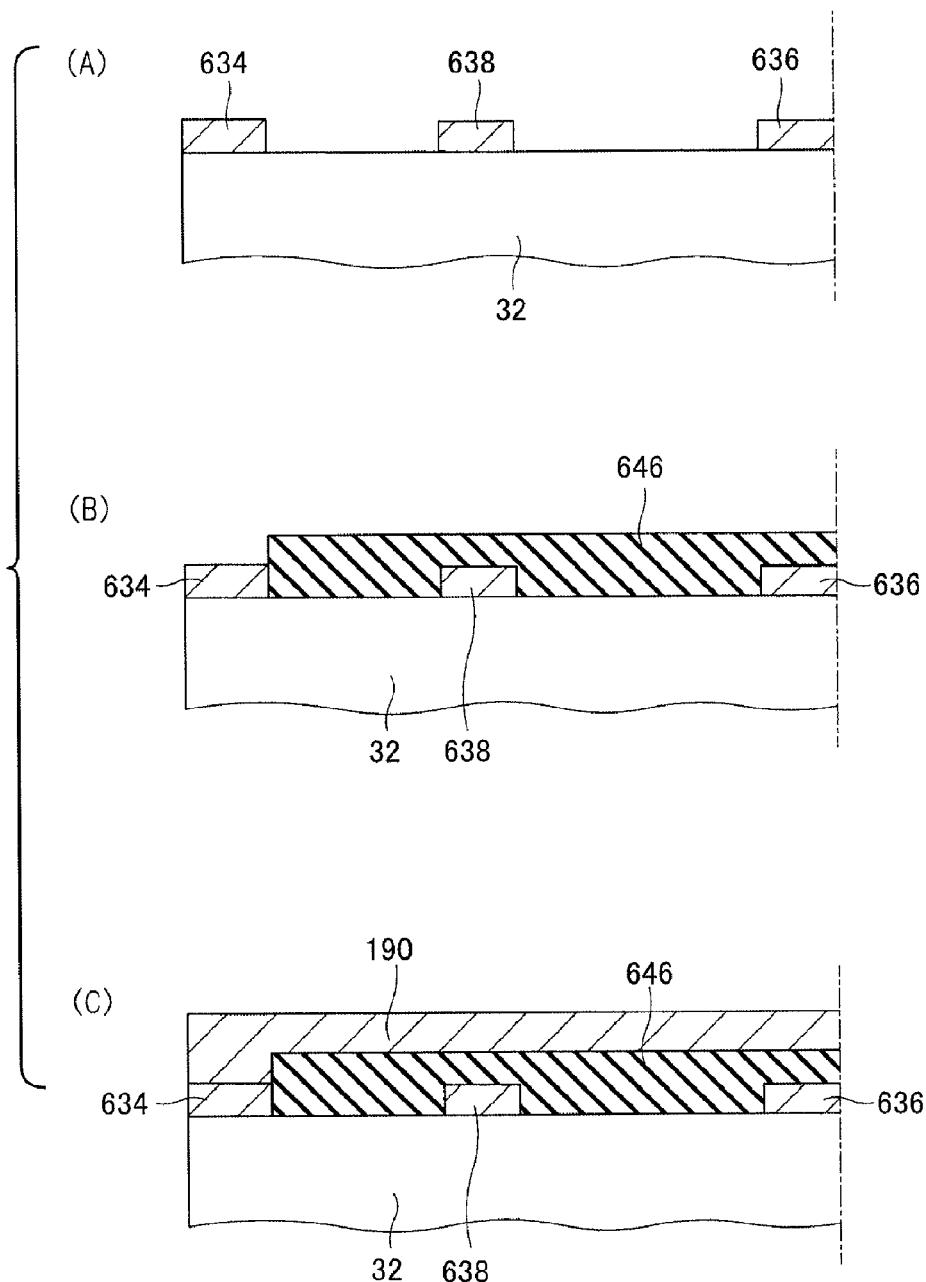
FIGS. 21 and 22 show, in order of process steps, a method of manufacturing FET 630 shown in FIGS. 19 and 20.
Figure 22:
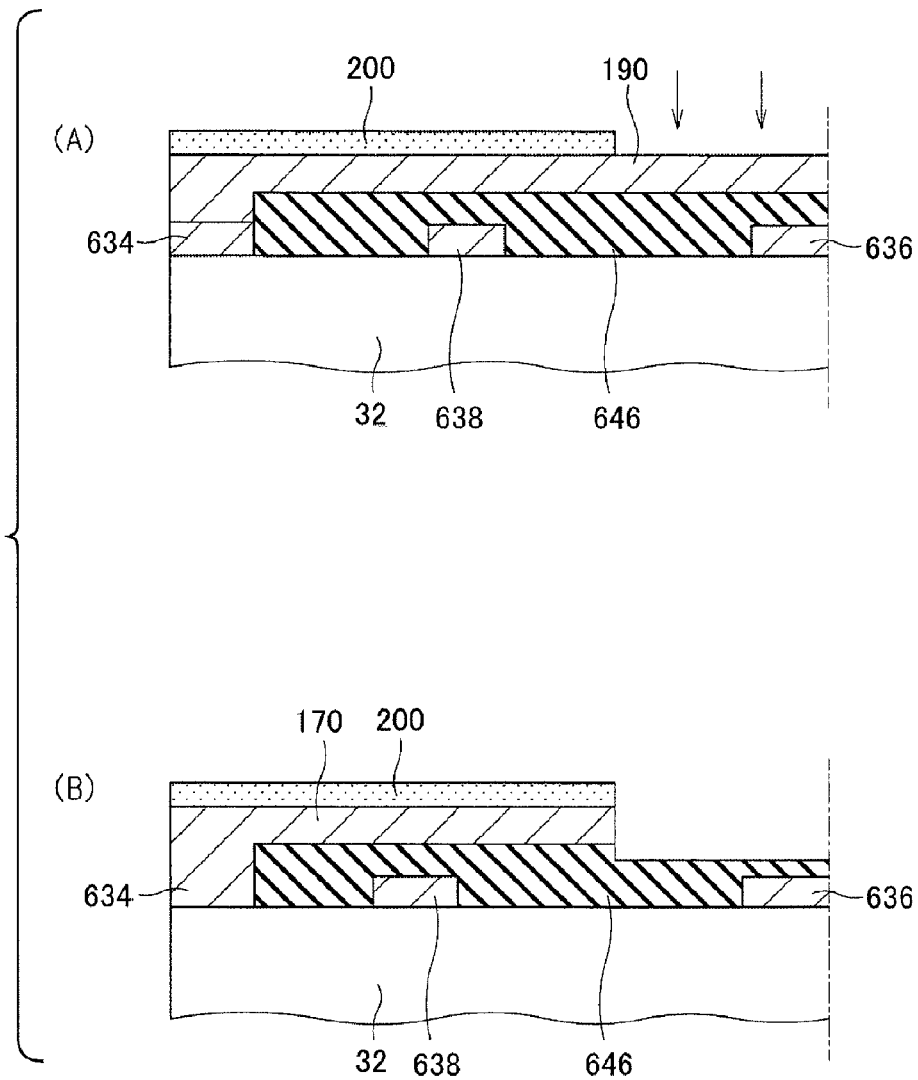

Referring to FIGS. 21 and 22, FET 630 in accordance with the present embodiment is manufactured in the following manner.

First, as shown in FIG. 21(A), source electrode 634 and drain electrode 636 are formed on the electron channel layer of GaN epitaxial substrate 32 by lift-off, and ohmic contact of these electrodes 634 and 636 are attained. Thereafter, gate electrode 638 is formed on the electron channel layer of GaN epitaxial substrate 32.

Next, as shown in FIG. 21(B), by sputtering, CVD or the like, dielectric film 646 (for example, film thickness: 350 nm) of $Ta_2O_5$ is formed.

Thereafter, as shown in FIG. 21(C), by metal film forming technique such as vacuum vapor deposition, sputtering or the like, metal such as nickel and gold is successively stacked on the entire surface, to form a field plate metal film 190.

Thereafter, as shown in FIG. 22(A), the field plate forming region is masked by applying a resist 200, and dry etching or RIE is performed with etching time adjusted. As a result, as shown in FIG. 22(B), part of field plate metal film 190 and part of dielectric film 646 in regions where resist 200 has not been applied are removed by etching, and source electrode 634 having field plate 170 is formed. At this time point, resist 200 is removed.

Through the series of process steps described above, FET 630 in accordance with the present embodiment shown in FIGS. 19 and 20 is manufactured.

Figure 23:
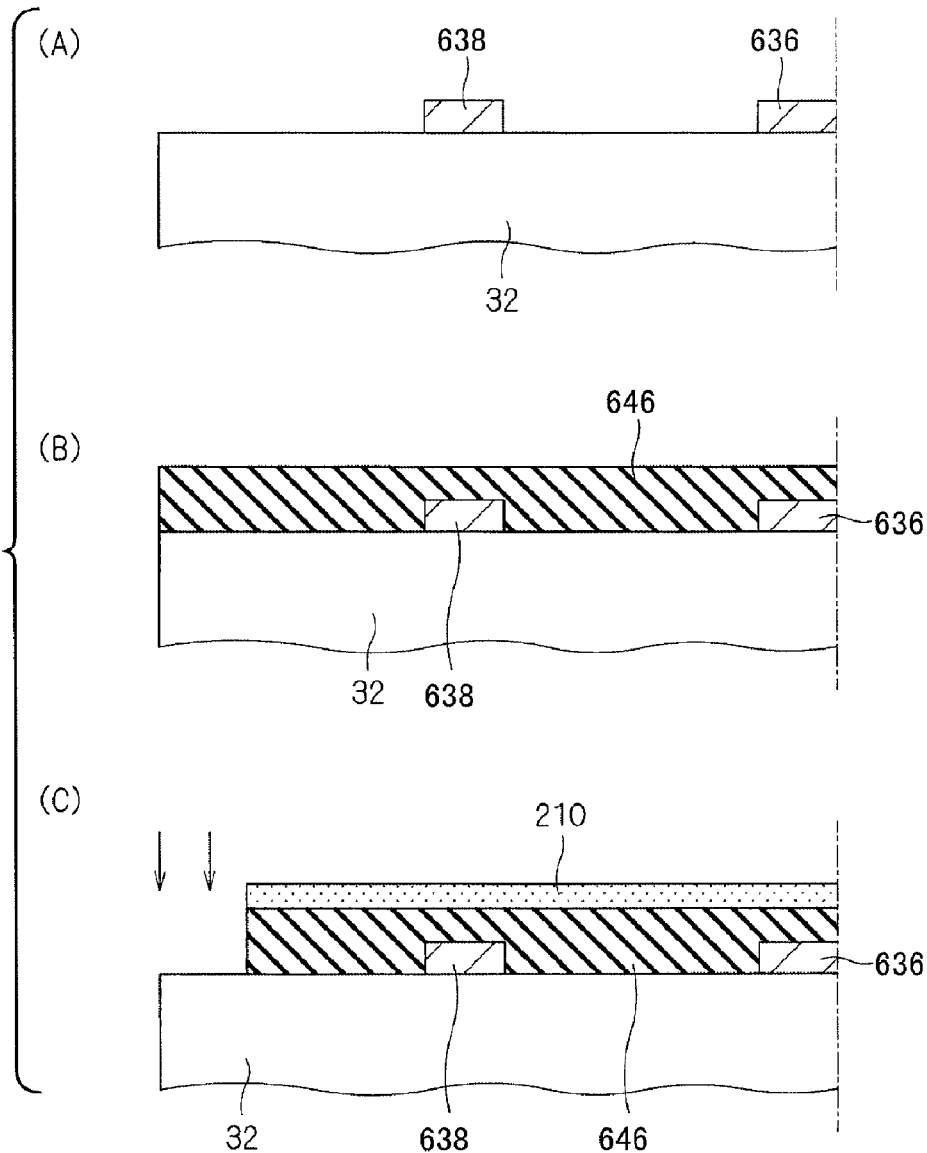

It is noted that FET 630 of the present invention can also be manufactured by the manufacturing method shown in FIGS. 23 and 24.

First, as shown in FIG. 23(A), drain electrode 636 is formed on the electron channel layer of GaN epitaxial substrate 32 by lift-off, and ohmic contact of this electrode 636 is attained. Thereafter, gate electrode 638 is formed on the electron channel layer of GaN epitaxial substrate 32.

Next, as shown in FIG. 23(B), by sputtering, CVD or the like, dielectric film 646 (for example, film thickness: 350 nm) of $Ta_2O_5$ is formed on the entire surface.

As shown in FIG. 23(C), regions other than the source forming region are masked by applying a resist 210, and dry etching or RIE is performed to remove dielectric film 646 in the source forming region so that the electron channel layer of GaN epitaxial substrate 32 is exposed. At this time point, resist 210 is removed.

Thereafter, as shown in FIG. 24(A), by metal film forming technique such as vacuum vapor deposition or sputtering, metal such as nickel and gold is successively stacked on the entire surface, to form gate metal film 212.

Thereafter, as shown in FIG. 24(B), the field plate forming region is masked by applying a resist 214, and dry etching or RIE is performed with etching time adjusted. As a result, as shown in FIG. 24(C), part of gate metal film 212 and a part of dielectric film 646 in the regions where resist 214 has not been applied, are removed by etching, and source electrode 634 having field plate 170 is formed. At this time point, resist 214 is removed.

In the structure described above, a prescribed gate voltage VG is applied to gate electrode 638, and a prescribed drain voltage VD is applied to drain electrode 636 with the voltage applied to source electrode 634 being the ground potential, whereby FET 630 operates.

When a high reverse voltage is applied across the gate and drain, the electric field applied on an end portion of gate electrode 638 on the side of drain electrode 636 is alleviated by the function of field plate 170 of source electrode 634. Therefore, gate breakdown voltage of FET 630 can be improved.

The dielectric film 646 is removed at a region immediately below field plate 170 of source electrode 634 to be flush with the terminal end surface of field plate 170, as represented by removed portion 176. The dielectric film extends from the lower end to drain electrode 636, to be overlapped on drain electrode 636. Particularly, assume that a large signal is operated. Here, the entire length of dielectric film 646 becomes longer than the length of field plate, and no corner is formed at the boundary between dielectric film 646 and the terminal end of field plate 170. As a result, high electric field concentration can be alleviated at the terminal end of field plate 170. As a result, FET 630 can be used as a high voltage semiconductor device.

The present invention is not limited to the embodiments described above. In the first, second and sixth embodiments, examples have been described in which the dielectric film has a single-layered structure formed of TaOx. The present invention is not limited to such a structure. The dielectric film may have a single-layered structure formed of SiNx, $SiO_2$ or HfOx. In the third to fifth embodiments, examples have been described in which the dielectric film has a two-layered structure, with the first dielectric film as the upper layer formed of TaOx and the second dielectric film as the lower layer formed of SiNx. The present invention, however, is not limited to such a structure. The first dielectric film as the upper layer may be formed of SiNx, $SiO_2$ or HfOx. In the fifth and sixth embodiments, a recess may be formed between the terminal end of field plate of the source electrode and the drain electrode. In that case, electric field concentration is shifted to the side of drain electrode, and therefore, electric field concentration at an end portion of gate electrode on the side of drain electrode can effectively be dispersed and alleviated. As to the shape of recess, it is not limited to a rectangular trench, and it may be a multi-stage recess with a side wall etched stepwise. Various other modifications and design changes may be made within the scope of the claims as appended to the present specification.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

What is claimed is:

1. A field effect transistor, comprising, on a surface layer of a semiconductor substrate, a source electrode and a drain electrode arranged spaced apart by a prescribed distance on opposite sides of a gate electrode, wherein a field plate protruding like a visor to the side of said drain electrode is formed at an upper portion of said gate electrode;

a dielectric film is formed between said field plate and a surface layer of said semiconductor substrate to which said source electrode and said drain electrode are in ohmic contact; and said dielectric film is partially removed at a region immediately below said field plate to be flush with a terminal end surface of said field plate and extends from a lower end of the removed portion to the drain electrode to be connected to said drain electrode, wherein the region of the partially removed portion is outside the peripheral of the field plate from the perspective perpendicular to the surface layer of the semiconductor substrate.

2. The field effect transistor according to claim 1, wherein the removed portion of said dielectric film has its depth set such that, when a prescribed gate voltage is applied to said gate electrode and a prescribed drain voltage is applied to said drain electrode with a voltage applied to said source electrode being ground potential, electric field strength at an upper end portion forming a boundary to the terminal end of said field plate and electric field strength at a lower end become equal to each other.

3. The field effect transistor according to claim 2, wherein said dielectric film has a recess formed between said drain electrode and the terminal end surface of said field plate.

4. The field effect transistor according to claim 3, wherein said dielectric film has a single-layered structure formed of TaOx, SiNx, SiO$_2$ or HfOx.

5. The field effect transistor according to claim 3, wherein said dielectric film has a two-layered structure; and dielectric constant of a first dielectric film as an upper layer is higher than dielectric constant of a second dielectric film as a lower layer.

6. The field effect transistor according to claim 5, wherein said second dielectric film is formed interposed between said gate electrode and a surface layer of said semiconductor substrate.

7. The field effect transistor according to claim 6, wherein said first dielectric film is formed of TaOx, SiNx, SiO$_2$ or HfOx; and said second dielectric film is formed of SiNx.

8. The field effect transistor according to claim 1, wherein said dielectric film has a recess formed between said drain electrode and the terminal end surface of said field plate.

9. The field effect transistor according to claim 1, wherein said dielectric film has a single-layered structure formed of TaOx, SiNx, SiO$_2$ or HfOx.

10. The field effect transistor according to claim 1, wherein said dielectric film has a two-layered structure; and dielectric constant of a first dielectric film as an upper layer is higher than dielectric constant of a second dielectric film as a lower layer.

* * * * *